(12) United States Patent
Clevenger et al.

(10) Patent No.: US 10,026,849 B2
(45) Date of Patent: Jul. 17, 2018

(54) STRUCTURE AND PROCESS FOR OVERTURNED THIN FILM DEVICE WITH SELF-ALIGNED GATE AND S/D CONTACTS

(71) Applicants: International Business Machines Corporation, Armonk, NY (US); STMicroelectronics, Inc., Coppell, TX (US)

(72) Inventors: Lawrence A. Clevenger, Rhinebeck, NY (US); Carl J. Radens, LaGrangeville, NY (US); Yiheng Xu, Hopewell Junction, NY (US); John H. Zhang, Altamont, NY (US)

(73) Assignees: INTERNATIONAL BUSINESS MACHINES CORPORATION, Armonk, NY (US); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 15/259,516

(22) Filed: Sep. 8, 2016

(65) Prior Publication Data
US 2017/0162711 A1    Jun. 8, 2017

Related U.S. Application Data

(62) Division of application No. 14/956,815, filed on Dec. 2, 2015, now Pat. No. 9,496,415.

(51) Int. Cl.
*H01L 21/8234* (2006.01)
*H01L 27/146* (2006.01)
(Continued)

(52) U.S. Cl.
CPC .......... *H01L 29/78693* (2013.01); *H01L 21/823437* (2013.01); *H01L 27/14614* (2013.01);
(Continued)

(58) Field of Classification Search
CPC ......... H01L 29/78693; H01L 29/78696; H01L 29/247; H01L 29/4908; H01L 29/41775;
(Continued)

(56) References Cited

U.S. PATENT DOCUMENTS

2002/0142531 A1* 10/2002 Hsu .............. H01L 21/768
438/183
2005/0001318 A1* 1/2005 Won .............. H01L 23/53238
257/751
(Continued)

OTHER PUBLICATIONS

Clevenger, Lawrence, et al., U.S. Appl. No. 14/956,815 entitled "Structure and Process for Overturned Thin Film Device With Self-Aligned Gate and S/D Contacts," filed with the U.S. Patent and Trademark Office on Dec. 2, 2015.
(Continued)

*Primary Examiner* — Galina Yushina
(74) *Attorney, Agent, or Firm* — Cantor Colburn LLP; Steven Meyers

(57) ABSTRACT

Processes and overturned thin film device structures generally include a metal gate having a concave shape defined by three faces. The processes generally include forming the overturned thin film device structures such that the channel self-aligns to the metal gate and the contacts can be self-aligned to the sacrificial material.

8 Claims, 30 Drawing Sheets

(51) Int. Cl.
*H01L 29/786* (2006.01)
*H01L 29/66* (2006.01)
*H01L 29/24* (2006.01)
*H01L 29/49* (2006.01)

(52) U.S. Cl.
CPC ........ *H01L 29/247* (2013.01); *H01L 29/4908* (2013.01); *H01L 29/66969* (2013.01); *H01L 29/78603* (2013.01); *H01L 29/78618* (2013.01); *H01L 29/78696* (2013.01)

(58) Field of Classification Search
CPC ........... H01L 29/66765; H01L 29/1037; H01L 29/66704; H01L 29/66348; H01L 29/66734; H01L 27/14614; H01L 21/823437; H01L 21/8234
See application file for complete search history.

(56) References Cited

U.S. PATENT DOCUMENTS

| | | | | |
|---|---|---|---|---|
| 2012/0139114 A1* | 6/2012 | Zhang | ............... | H01L 21/76849 257/751 |
| 2012/0273774 A1* | 11/2012 | Noda | ............... | H01L 21/823807 257/43 |
| 2013/0082242 A1* | 4/2013 | Han | ............... | H01L 29/42384 257/29 |
| 2015/0097289 A1* | 4/2015 | Zhang | ............... | G02B 6/1225 257/751 |
| 2015/0279837 A1* | 10/2015 | Lee | ............... | H01L 27/088 257/392 |

OTHER PUBLICATIONS

List of IBM Patents or Patent Applications Treated as Related; (Appendix P), Filed Sep. 13, 2016; 2 pages.

* cited by examiner

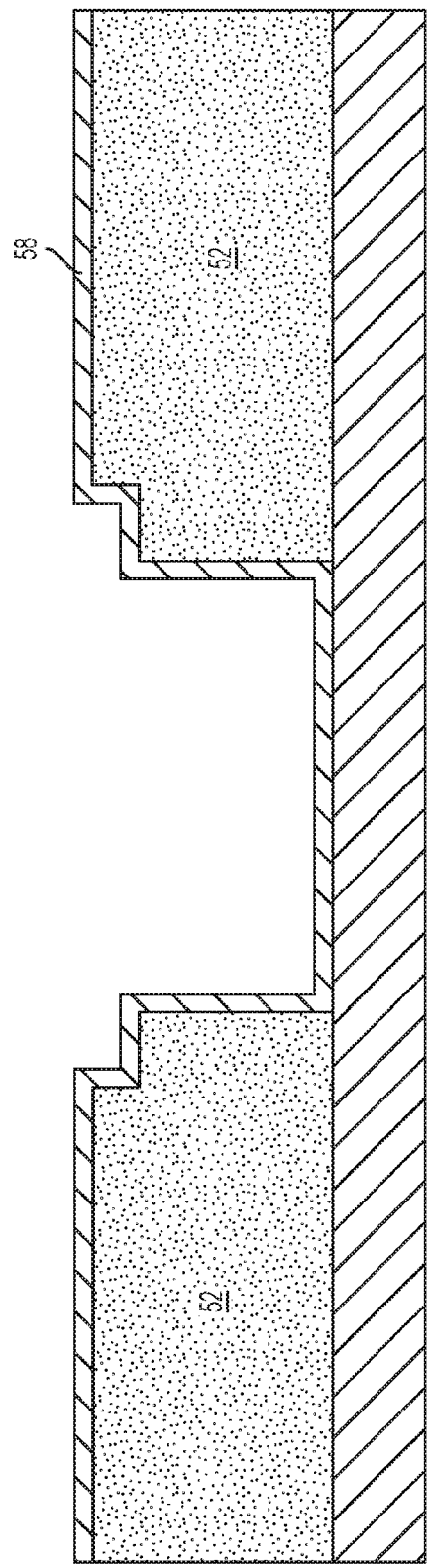

STRUCTURE AND PROCESS FOR OVERTURNED THIN FILM DEVICE WITH SELF-ALIGNED GATE AND S/D CONTACTS

DOMESTIC PRIORITY

The present application is a DIVISIONAL of U.S. patent application Ser. No. 14/956,815, filed on Dec. 2, 2015, the contents of which are incorporated herein by reference in its entirety.

BACKGROUND

The present invention generally relates to metal oxide thin film devices, and more particularly, to the structure and formation of an overturned thin film device with self-aligned gate and source/drain contacts.

In the semiconductor industry and especially thin film semiconductor devices such as thin film transistors (TFTs), the devices include spaced apart source and drain areas that conduct through a channel layer positioned therebetween. At least one gate insulator and gate electrode are positioned above and/or below the channel layer, to control the conduction.

SUMMARY

The present invention is generally directed to thin film device structures and methods of fabricating a transistor device. In one embodiment, the thin film device structure comprises a metal gate structure having a concave shape defined by three faces; and a channel comprising an amorphous metal oxide material overlaying and self-aligned to the metal gate structure.

A method of fabricating a transistor device comprises forming a light transparent insulating layer on a substrate; selectively etching an opening in the light transparent insulating layer to expose a surface of the substrate, wherein the opening is defined by a bottom surface and sidewalls extending from the bottom surface to an upper surface of the light transparent insulating layer; conformally depositing a liner layer onto the substrate and the light transparent insulating layer including the sidewalls and the bottom surface defined by the opening; depositing a metal conductive layer over the substrate and partially filling the via; and chemically mechanically polishing or anisotropically etching the metal conductive layer and the liner layer, wherein the light transparent insulator layer provides a stop (i.e., wherein the procedure ends by reaching the light transparent layer); and removing portions of the metal conductive layer and the liner layer to expose sidewalls of the trench such that remaining portions of the metal conductive layer and the liner layer define a gate electrode in the opening, wherein the gate electrode has a concave shape defined by three faces.

In one embodiment, the method may further include conformally depositing a gate insulating layer over the substrate and layers thereon; conformally depositing an amorphous metal oxide layer over the substrate and layers thereon; depositing and reflowing a sacrificial insulator layer to form a planar surface over the substrate and layers thereon; pattern etching the amorphous metal oxide layer and sacrificial insulator layer, wherein the patterned amorphous metal oxide layer defines a channel; etching the sacrificial insulating layer to expose end portions of the channel and define a self-aligned step width (t); conformally depositing a conductive metal layer and forming source/drain regions on the exposed end portions of the channel by removing the conductive metal layer overlaying the sacrificial insulator layer, thereby effecting gate-aligned source and drain regions; and removing the sacrificial layer.

In another embodiment, the method includes selectively etching the opening in the light transparent insulating layer to the substrate comprises a dual damascene process, wherein the opening is defined by a trench and a via, wherein subsequent to chemically mechanically polishing or anisotropically etching the metal conductive layer to the light transparent insulator layer, further comprising a metal recess etching step to stop on the light transparent insulating layer to define a self-aligned step width (t) for the channel.

In another embodiment, the method includes forming a gate structure (i.e., a gate electrode and a gate insulating layer) having a concave shape defined by three faces by a dual damascene process; conformally depositing a gate insulating layer overlying the metal gate; depositing an amorphous metal oxide layer overlying the gate insulating layer; depositing a sacrificial insulator layer onto the amorphous metal oxide layer; chemically mechanically polishing the sacrificial insulator layer to stop on the amorphous metal oxide layer, wherein a remaining portion of the sacrificial insulator layer overlays the gate structure; selectively etching the amorphous metal oxide layer to define a channel and expose end portions of the channel to define a self-aligned step width (t); selectively etching to remove a portion of the gate insulator layer and define a contact step height (h) for the exposed end portions of the channel; conformally depositing a conductive metal layer and forming source/drain regions on the exposed end portions including the self-aligned step width (t) and contact step height (h) of the channel by removing the conductive metal layer overlaying the sacrificial insulator layer, thereby effecting gate-aligned source and drain regions; and removing the sacrificial insulator layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1A:
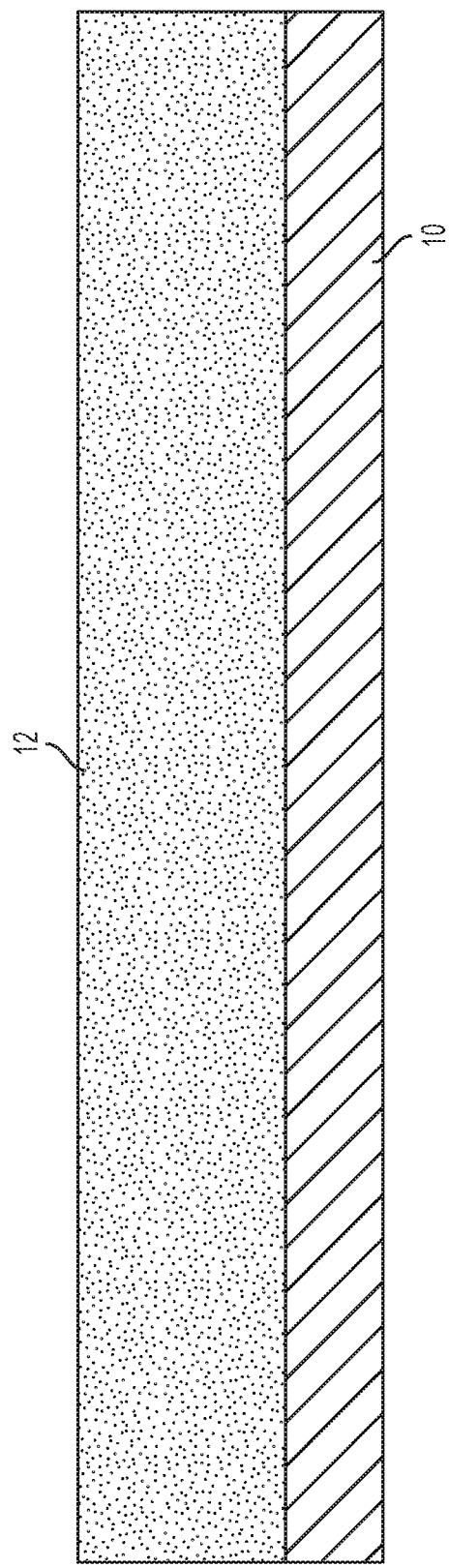
FIGS. 1A-1N depicts schematic cross-sectional views illustrating a sequential process for fabricating an overturned thin film with self-aligned gate source/drain regions according to an embodiment of the present invention.

The detailed description explains the preferred embodiments of the invention, together with advantages and features, by way of example with reference to the drawings.

DETAILED DESCRIPTION

The present invention provides an overturned thin film structure and process for fabricating the same with self-aligned gate source/drain contacts according to an embodiment of the present invention. As will be discussed herein, the process and resulting structure self-aligns the channel to the gate.

There is a strong interest in amorphous metal oxide semiconductor as potential replacements for the organic and silicon materials in thin-film electronics because of its high carrier mobility, light transparency and low deposition temperature. The high carrier mobility in the amorphous state expands applications to higher performance domains that require higher frequency or higher current, e.g., active-matrix electronics, including displays, sensor arrays and X-ray detectors. The light transparency eliminates the need for a light shield in display and sensor active matrices. The low deposition temperature enables application to flexible electronics on plastic substrates. Moreover, their solution processability and optical transparency have opened new horizons for low-cost printable and transparent electronics on plastic substrates. But metal-oxide formation by the sol-gel route typically requires an annealing step at relatively high temperature, which has prevented the incorporation of these materials with the polymer substrates used in high-performance flexible electronics.

More recently, a general method has been reported for forming high-performance and operationally stable metal-oxide semiconductors at room temperature, by deep-ultra-violet photochemical activation of sol-gel films. Deep-ultra-violet (DUV) irradiation induces efficient condensation and densification of oxide semiconducting films by photochemical activation at low temperature. This photochemical activation is applicable to numerous metal-oxide semiconductors, and the performance (in terms of transistor mobility and operational stability) of thin-film transistors fabricated by this route compares favorably with that of thin-film transistors based on thermally annealed materials. The field-effect mobilities of the photo-activated metal-oxide semiconductors are as high as 14 and 7 $cm^2 V^{-1} s^{-1}$ (with an $Al_2O_3$ gate insulator) on glass and polymer substrates, respectively.

The unique features of metal oxide semiconductors are: (1) carrier mobility is less dependent on grain size of films, that is, high mobility amorphous metal oxide is possible; (2) density of surface states is low and enables easy field effect for TFTs, this is contrary to covalent semiconductors (such as Si or a-Si) where surface states have to be passivated by hydrogen; and (3) mobility strongly depends on the volume carrier density. In order to achieve high mobility for high performance applications, the volume carrier density of the metal oxide channel should be high and thickness of the metal oxide film should be small (e.g. <100 nm and preferably <50 nm).

However, a major deficiency of metal oxide semiconductors is stability and the tendency to become polycrystalline at higher process temperatures. Popular metal oxides, such as zinc oxide, indium zinc oxide, and indium gallium zinc oxide, are not very stable and become polycrystalline at moderate process temperatures (e.g. greater than approximately 400° C.) Polycrystalline semiconductor metal oxides are not desirable in semiconductor devices for several reasons. For example, the characteristics of transistors formed in polycrystalline semiconductor metal oxides can vary, even between adjacent devices in an array, because of the variation in crystal size and position. To better understand this problem, in a conduction area under a sub-micron gate each different transistor can include from one or two poly-silicon crystalline grains to several crystalline grains and the different number of crystals in the conduction area will produce different characteristics. The dimensions and their physical characteristics among different grains are also different.

The stability of metal oxide thin film transistors (TFTs) depends strongly on processing temperatures. At high temperatures, the traps in the bulk semiconductor layer and at the interface or interfaces between the gate insulator and the semiconductor layer can be reduced. For applications, such as active matrix organic light emitting devices (AMOLED), extreme stability is required. It is advantageous to take the metal oxide TFTs to high temperatures, generally between 250° C. and 700° C., during processing. Meanwhile it is desirable to maintain the amorphous nature of the metal oxide at these processing temperatures.

But metal-oxide formation by the sol-gel route requires an annealing step at relatively high temperature, which has prevented the incorporation of these materials with the polymer substrates used in high-performance flexible electronics.

Referring now to FIG. 1A, a light transparent insulator layer 12 is first deposited onto a light transparent substrate 10. Typical materials for the substrate 10 include glass, plastic film, and the like. The substrate 10 can be in rigid, conformable, or flexible forms. Fabrication on a thin flexible plastic substrate generally requires all process temperatures to be below its glass temperature, Tg (above which permanent deformation occurs so that pattern alignment among different layers becomes impractical). The light transparent insulator 12 is not intended to be limited and is generally a material transparent to the radiation wavelengths transmitted for the intended display.

Figure 1B:
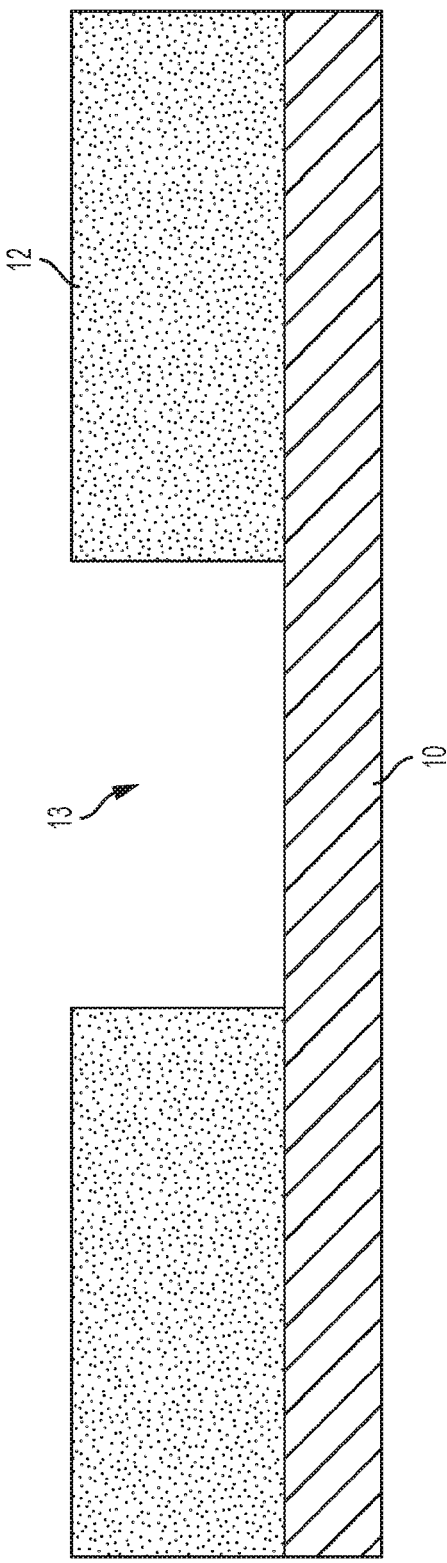

In FIG. 1B, an etch of the light transparent insulator 12 is performed using conventional photolithographic techniques to form an opening 13 for the gate structure.

Figure 1C:
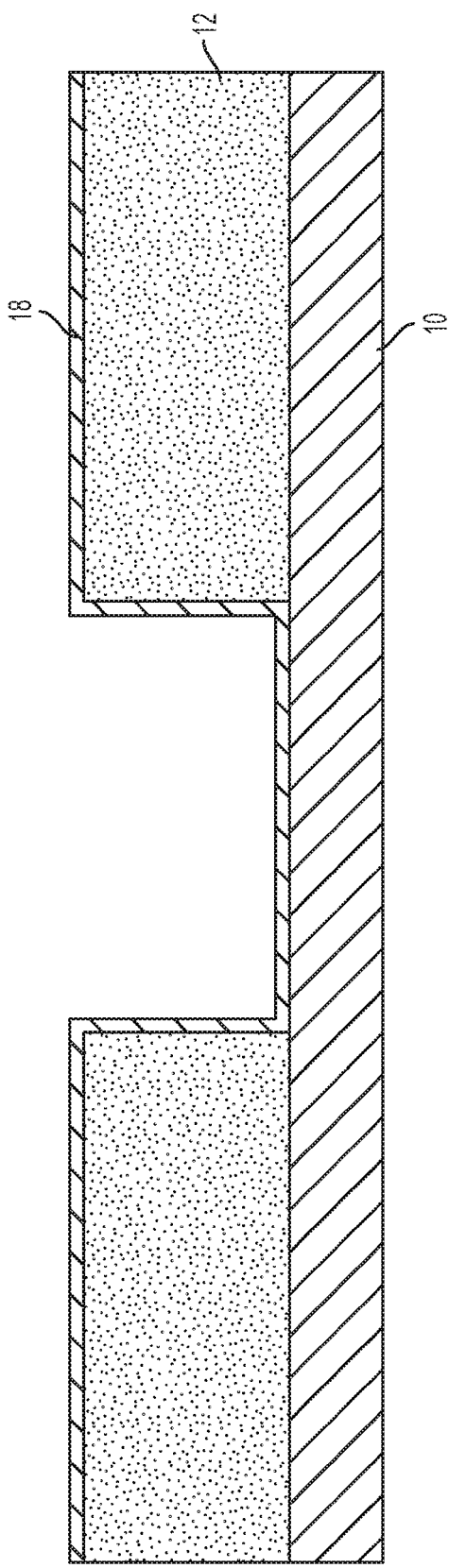

In FIG. 1C, a relatively thin layer of a conformal liner 18 is then deposited over the underlying topography. The liner layer 18 is not intended to be limited and may be a metal selected from the group consisting of titanium (Ti), tantalum (Ta), ruthenium (Ru), iridium (Ir), cobalt (Co) and nitrides thereof. An optional adhesion layer, not specifically shown, can be used to enhance the bonding of the metal liner layer 18 to the light transparent insulator 12.

The presence of the liner layer 18 on the sidewalls is desirable because structural delamination and conductor metal diffusion can occur unless there is a layer of protection, i.e., a liner layer, between the conductive layer and the etched insulating layer. For structural integrity, the liner layer 18 should line the entire side wall and will generally cover the etched bottom surface as well. The liner layer 18 can be at a thickness less than 10 nm to greater than 1 nm in most embodiments, and less than 5 nm to 1 nm in other embodiments, and about 3 nm in still other embodiments.

Figure 1D:
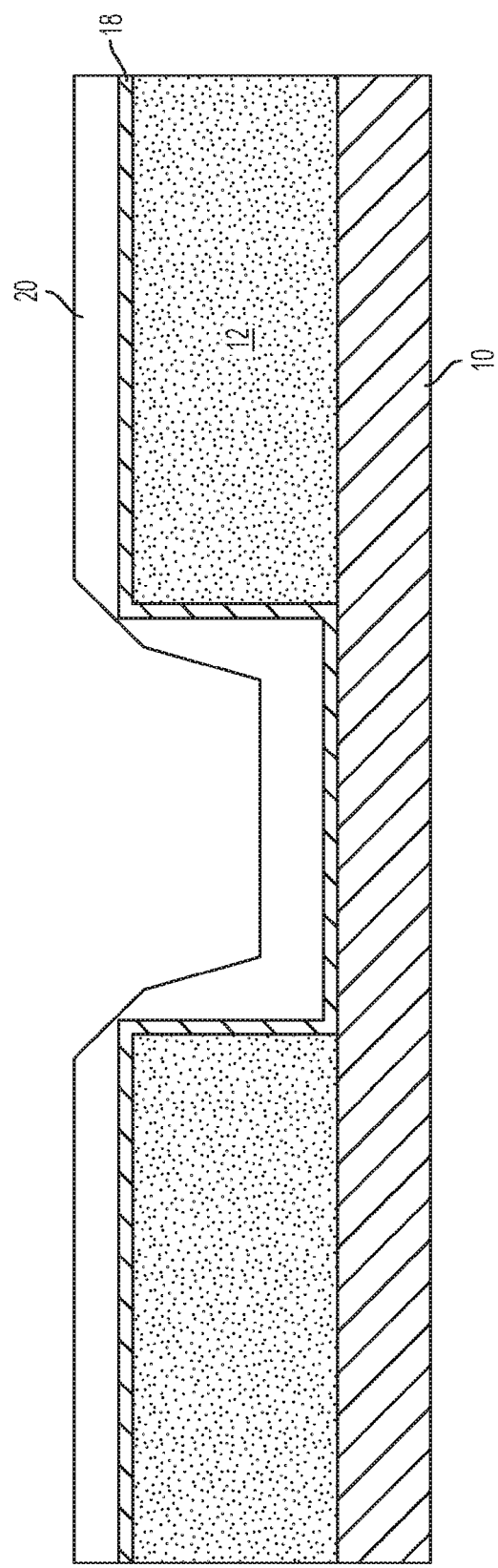

In FIG. 1D, a conductive metal layer 20 is partially deposited onto the liner layer 18. The conductive metal material may be selected from the group consisting of nickel (Ni), silver (Ag), gold (Au), palladium (Pd), cobalt (Co), copper (Cu), iron, (Fe), aluminum (Al), chromium (Cr), platinum (Pt), tungsten (W), and combinations thereof. The conductive metal material is deposited at a thickness of about 0.1 nanometer (nm) to about 100 nm so as to partially fill the trenches and vias. In one embodiment, the conductive metal material 20 is deposited at a thickness of about 80 nm.

The liner and conductive metal materials may be deposited by sputtering, CVD, electroless deposition and/or electrodeposition. Rf bias sputtering, in general, is known in the art and involves the reemission of material during the sputter deposition thereof through the effects of attendant ion bombardment of the layer being deposited. In effect, Rf biased sputtering is the positive ion bombardment of a substrate or film during its deposition. Therefore, during Rf bias sputtering, there is always simultaneous etching and deposition of the material being deposited. Previously deposited layers are not etched as part of a standard Rf biased sputter deposition.

Figure 1E:
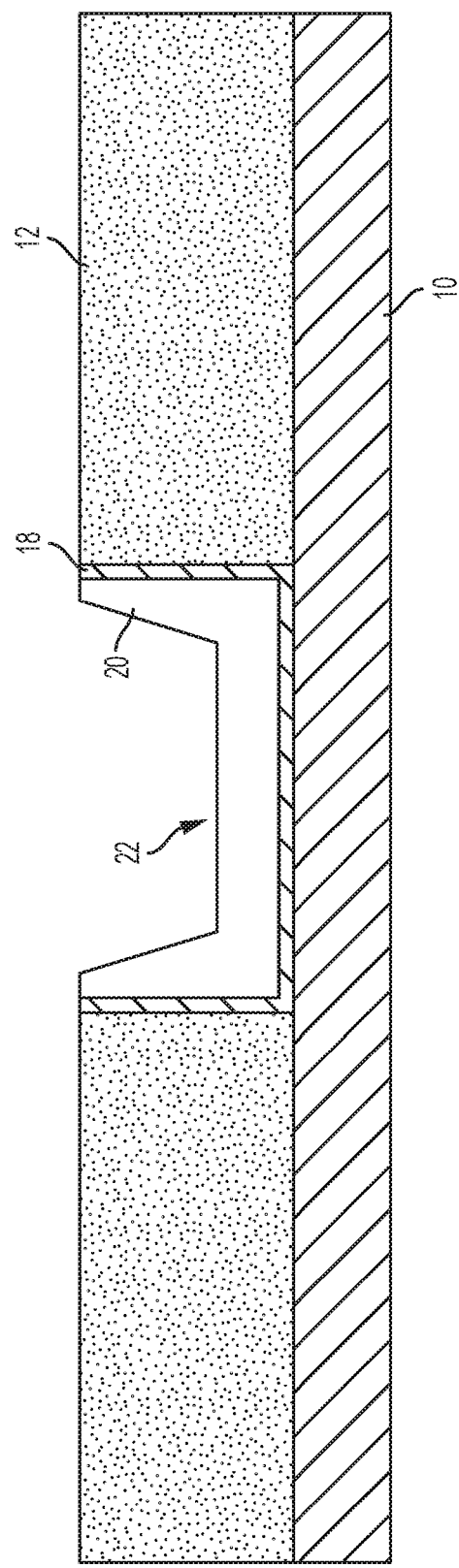

In FIG. 1E, a chemical mechanical polishing (CMP) or anisotropic etch procedure is performed and configured to stop at the light transparent insulator layer 12 so as to remove the portion of the metal liner and the conductive metal overlying the uppermost surface of the light transparent insulator. As will be described in greater detail below, the resulting gate 22 of the overturned thin film device provides a three face design (unlike the single face of the prior art), which provides high on-current performance and provides increased latitude for gate length shrink for light emitting diode (LED) resolution improvement.

Figure 1F:
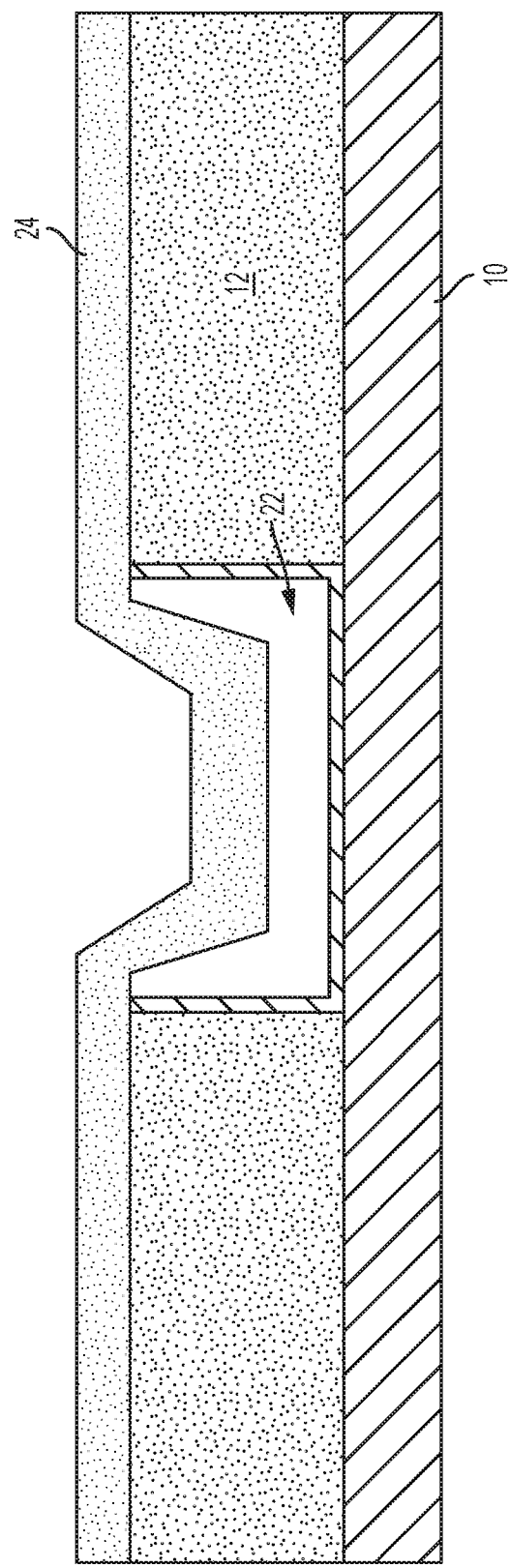

In FIG. 1F, a conformal gate insulating layer 24 of an insulating material well known in the art for use in semiconductor device manufacture is deposited onto the gate 22 using atomic layer deposition (ALD). For example, the gate insulating layer 24 may be formed of hafnium oxide ($HfO_2$), which has a higher dielectric constant relative to silicon dioxide ($SiO_2$), aluminum oxide ($Al_2O_3$), silicon nitride ($Si_3N_4$) or a combination thereof. By way of example, the thickness of the gate insulating layer 24 can be about 35 nm.

Figure 1G:
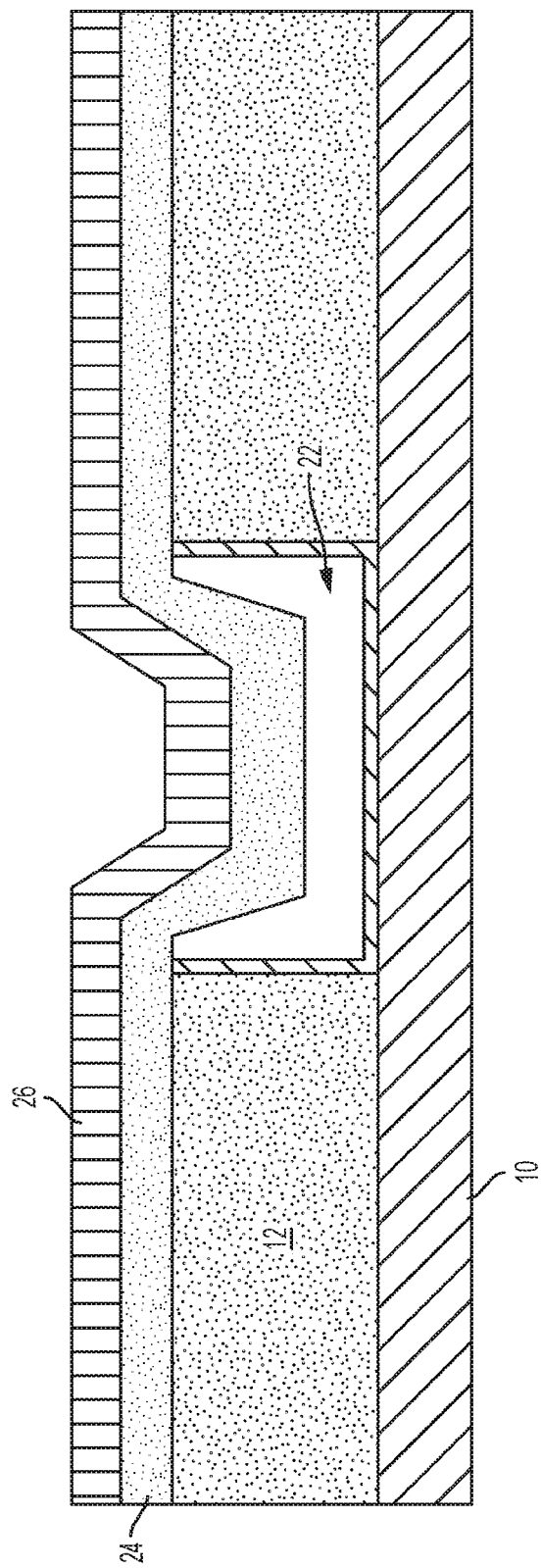

In FIG. 1G, a metal oxide channel layer 26 is conformally deposited onto the gate insulating layer 24. In one embodiment, the metal oxide channel layer 26 is an amorphous metal oxide including, but not limited to, indium gallium zinc oxide (IGZO), indium zinc oxide (IZO), indium zinc tin oxide (IZTO,) and indium oxide (In2O3) for high mobility performance. The amorphous metal oxide may be formed by depositing a precursor material in any well-known manner and then photo- or thermally annealing. For low temperature processing such as may be desired for fabrication using flexible polymeric (plastic) substrates, photo annealing can be readily utilized to fabricate the metal oxide channel layer.

Referring now to Tables 1 and 2, there is shown precursor concentrations suitable for fabricating the particular amorphous metal oxide and the resulting mobility performance as a function of time and photo-exposure (DUV) or annealing temperature in the case of a thermal anneal process, respectively. The solvent for the different precursors was 2-mercaptoethanol (2-ME).

TABLE 1

| | Precursor Concentration (M) | | | | | |
|---|---|---|---|---|---|---|
| Channel Material | Indium Nitrate Hydrate | Gallium Nitrate Hydrate | Zinc Acetate Dihydrate | Zinc Chloride | Tin Chloride | Solvent |
| IGZO | 0.085 | 0.0125 | 0.0275 | — | — | 2-ME |
| IZO | 0.05 | — | 0.05 | — | — | 2-ME |
| In$_2$O$_3$ | 0.10 | — | — | — | — | 2-ME |
| IZTO | 0.03 | — | — | 0.12 | 0.12 | 2-ME |

TABLE 2

| Channel | Annealing Method | Annealing Time (min) | Average Mobility ($cm^2V^{-1}s^{-1}$) |
|---|---|---|---|
| IGZO | Photo Annealing | 30 | 0.7 |
| | | 60 | 1.9 |
| | | 90 | 1.6 |
| | | 120 | 2.3 |

TABLE 2-continued

| Channel | Annealing Method | Annealing Time (min) | Average Mobility ($cm^2V^{-1}s^{-1}$) |
|---|---|---|---|
| IZO | Photo Annealing | 30 | 0.1 |
| | | 60 | 0.1 |
| | | 90 | 1.2 |
| | | 120 | 0.4 |
| In$_2$O$_3$ | Photo Annealing | 30 | 1.9 |
| | | 60 | 2.8 |
| | | 90 | 3.5 |
| | | 120 | 3.6 |
| ZTO | Thermal Annealing (600° C.) | 10 | 4.5 |
| | Photo Annealing | 90 | Inactive |
| IZTO | Thermal Annealing @ (500° C.) | 10 | 1.5 |
| | Photo Annealing | 90 | Inactive |

As shown in Table 2, high mobility of the channel material was observed upon photo annealing via a condensation mechanism using a low pressure mercury light lamp.

Figure 1H:
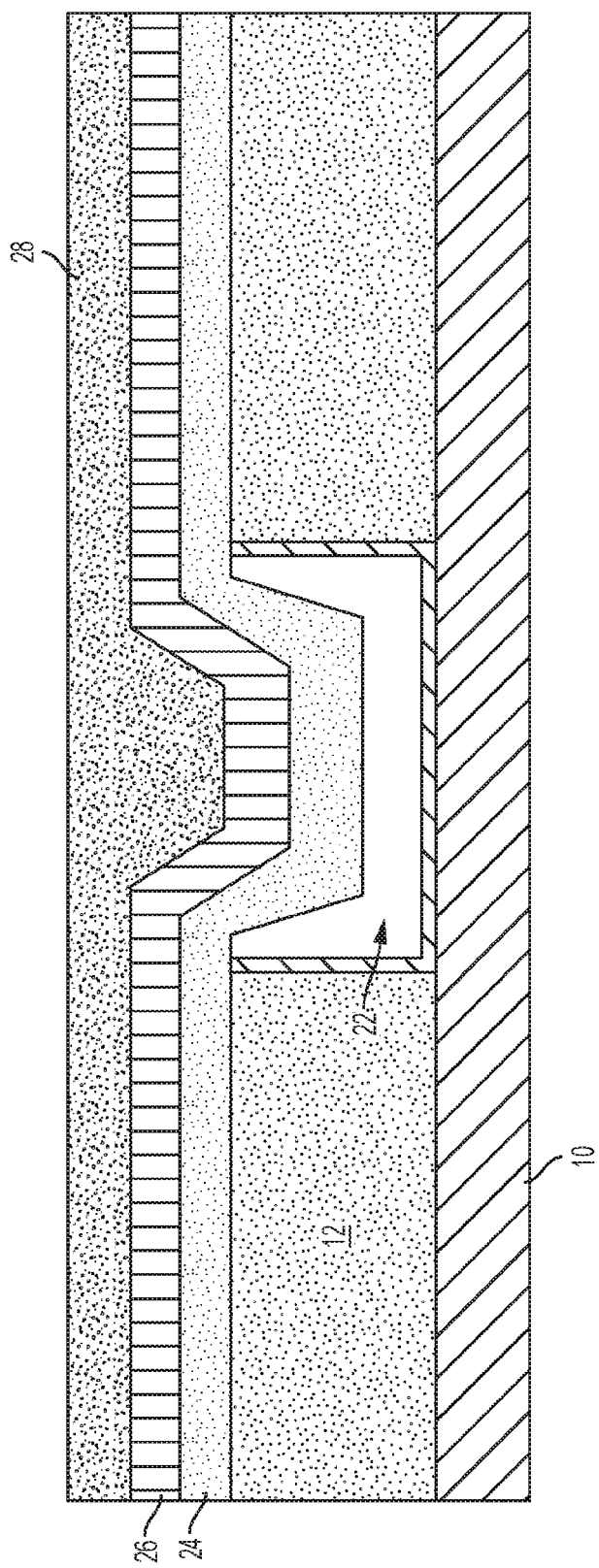
Figure 11:
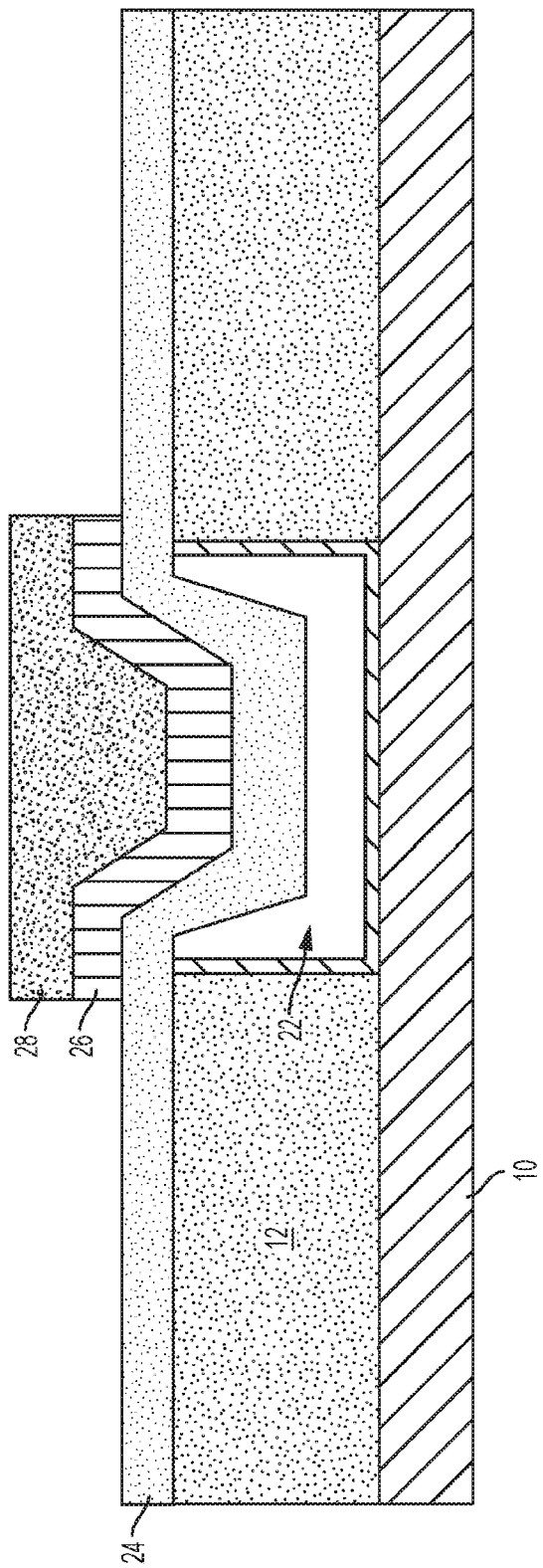

In FIG. 1H, a sacrificial dielectric insulator layer 28 is deposited and reflowed onto the metal oxide channel layer 26.

In FIG. 1I, the metal oxide channel layer 26 and sacrificial dielectric insulator layer 28 are pattern etched and configured to stop at the gate insulator layer 24.

Figure 1J:
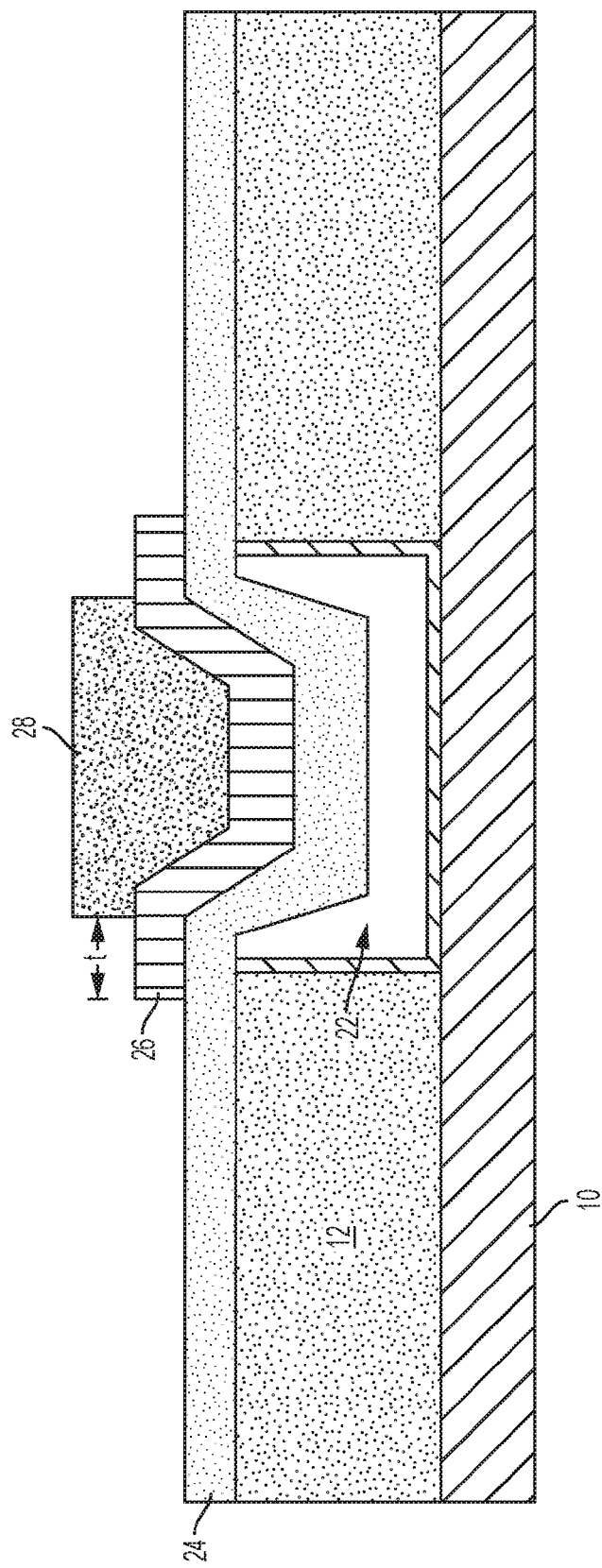

In FIG. 1J, a selective reactive ion etch or wet etch of the sacrificial dielectric insulator layer 28 is performed to define a self-aligned step width (t). The parasitic capacitances resulting from the overlap of source/drain regions with the gate structure can be minimized through the step width (t) with self-alignment. Advantageously, the source/drain regions can be defined without requiring an extra hard mask step as is typically done in the prior art, and consequently, significantly reduces manufacturing costs and throughput.

Figure 1K:
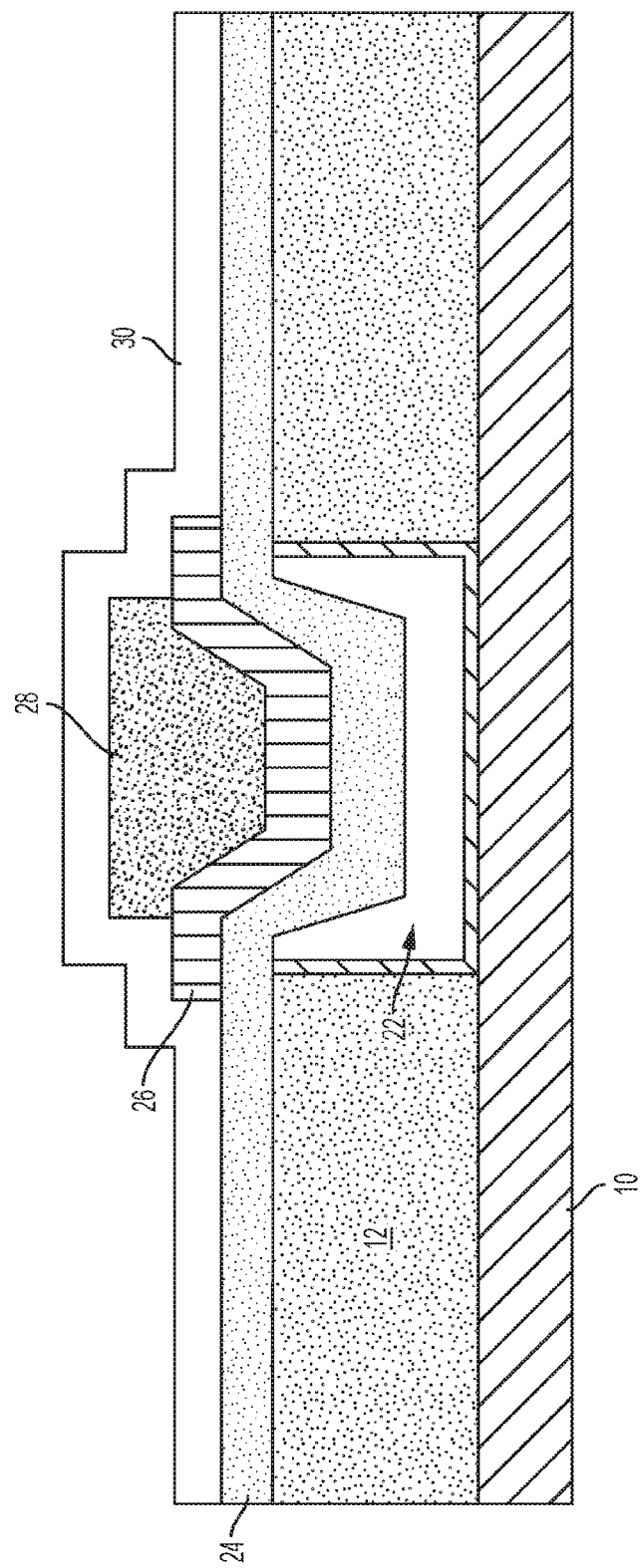

In FIG. 1K, a layer of conductive metal 30 is deposited, which will subsequently be patterned to form the source and drain regions. For example, each of the source and the drain regions may be formed of a metal, e.g., Ti, Pt, ruthenium (Ru), Au, silver (Ag), molybdenum (Mo), Al, W, Cu, combinations thereof, or a metal or conductive oxide, e.g., IZO, AZO, or combinations thereof.

Figure 1L:
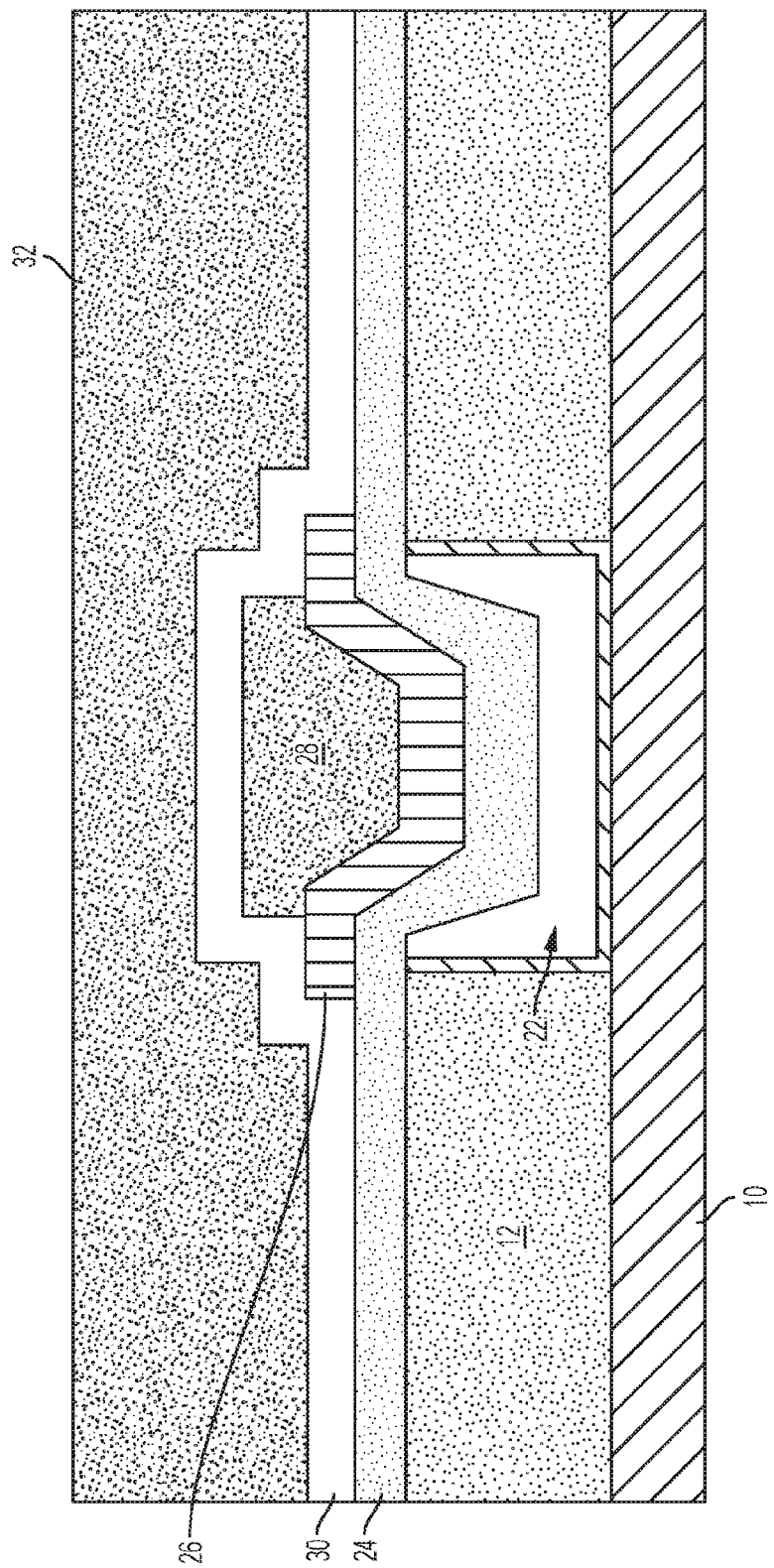

In FIG. 1L, a sacrificial insulator layer 32 is reflowed over the topography to form a planar top surface.

Figure 1M:
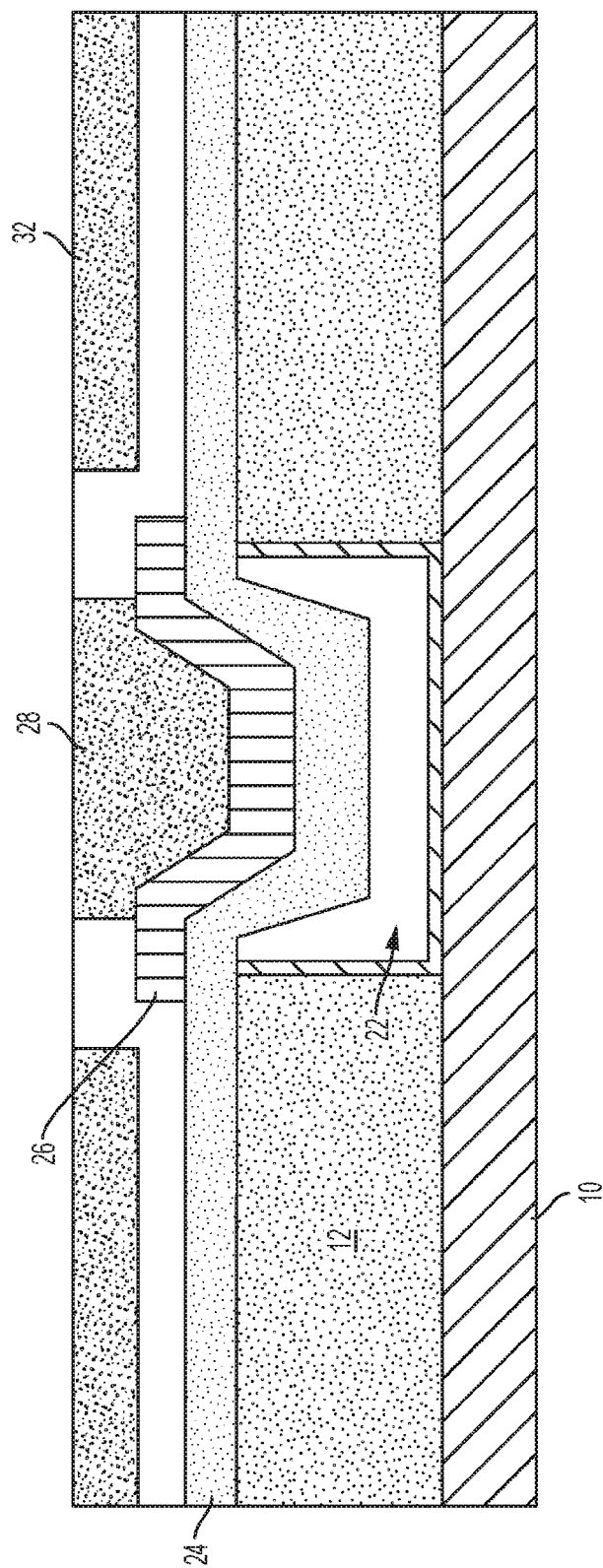

In FIG. 1M, a CMP or etch back procedure is performed to remove a portion of the sacrificial layer 32 and the portion of the source/drain metal layer 30 that had previously been deposited directly above the gate structure 22 and metal oxide channel 26.

Figure 1N:
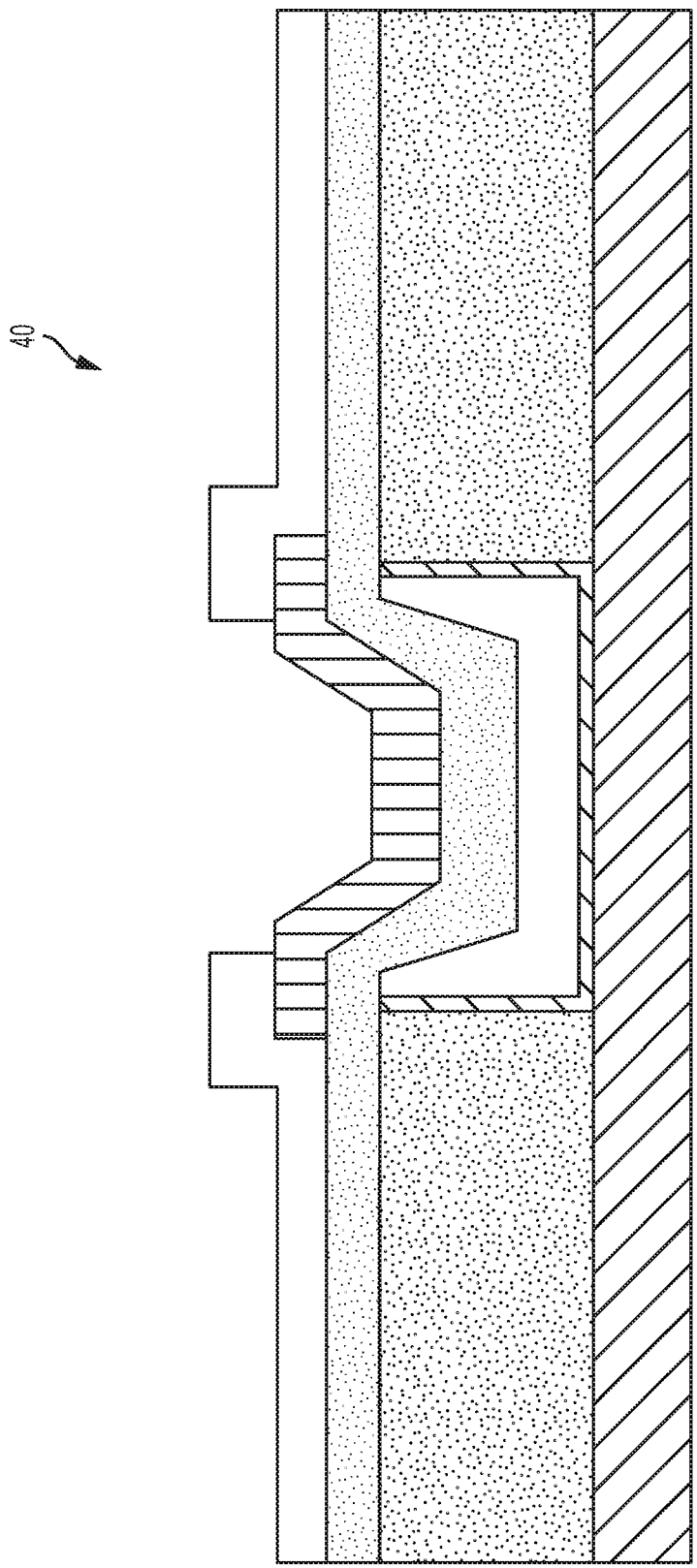

In FIG. 1N, the remaining sacrificial insulator layer 32 is then removed so as to provide a high performance flexible thin film transistor structure 40, which can include an amorphous metal oxide channel material for high mobility performance. Additionally, the TFT includes step width control (t) to minimize the overlap of the metal gate, i.e., electrodes and reduce the parasitic capacitances for high efficient light emitting diode (LED) performance. Still, further, the device as shown includes a three face gate structure design for high on-current performance and provides margins for gate length shrink as is desired for LED resolution improvement.

Figure 2A:
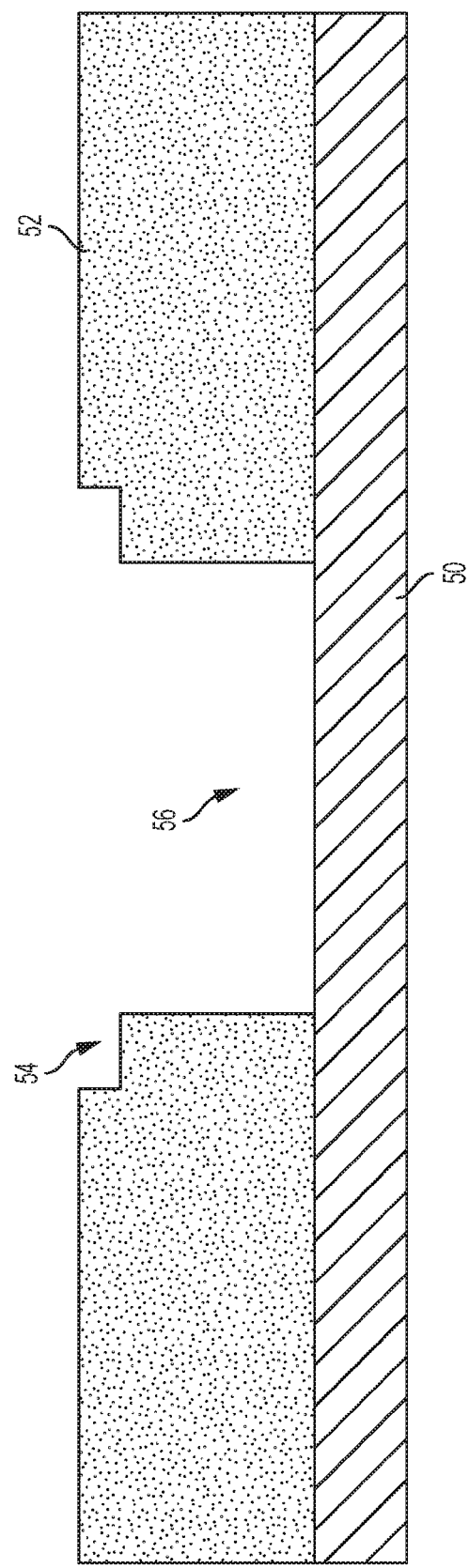
FIGS. 2A-2O depicts schematic cross-sectional views illustrating a sequential process for fabricating an overturned thin film with self-aligned gate source/drain contacts according to another embodiment of the present invention.

In another embodiment, after the light transparent insulating layer 52 has been deposited onto a suitable substrate 50 (similar to substrate 10 above), a dual damascene etch is performed as shown in FIG. 2A, wherein a trench 54 and a via 56 are formed in the light transparent insulating layer 52.

In FIG. 2B, a relatively thin layer of a conformal liner 58 is then deposited over the topography. The liner layer 58 is not intended to be limited and may be a metal selected from the group consisting of titanium (Ti), tantalum (Ta), ruthenium (Ru), iridium (Ir) and nitrides thereof. An optional adhesion layer, not specifically shown, can be used to enhance the bonding of the metal liner layer 58 to the dielectric layer.

For reasons discussed above, the presence of the metal liner layer 58 on the sidewalls of the via is desirable because structural delamination and conductor metal diffusion can occur unless there is a layer of protection, a liner layer, between the conductive layer and the etched insulating layer. For structural integrity, the metal liner layer 58 should line the entire side wall and will generally cover the bottom of the via as well. The metal liner layer can be at a thickness less than 10 nm to greater than 1 nm in most embodiments, and less than 5 nm to 1 nm in other embodiments, and about 3 nm in still other embodiments.

Figure 2C:
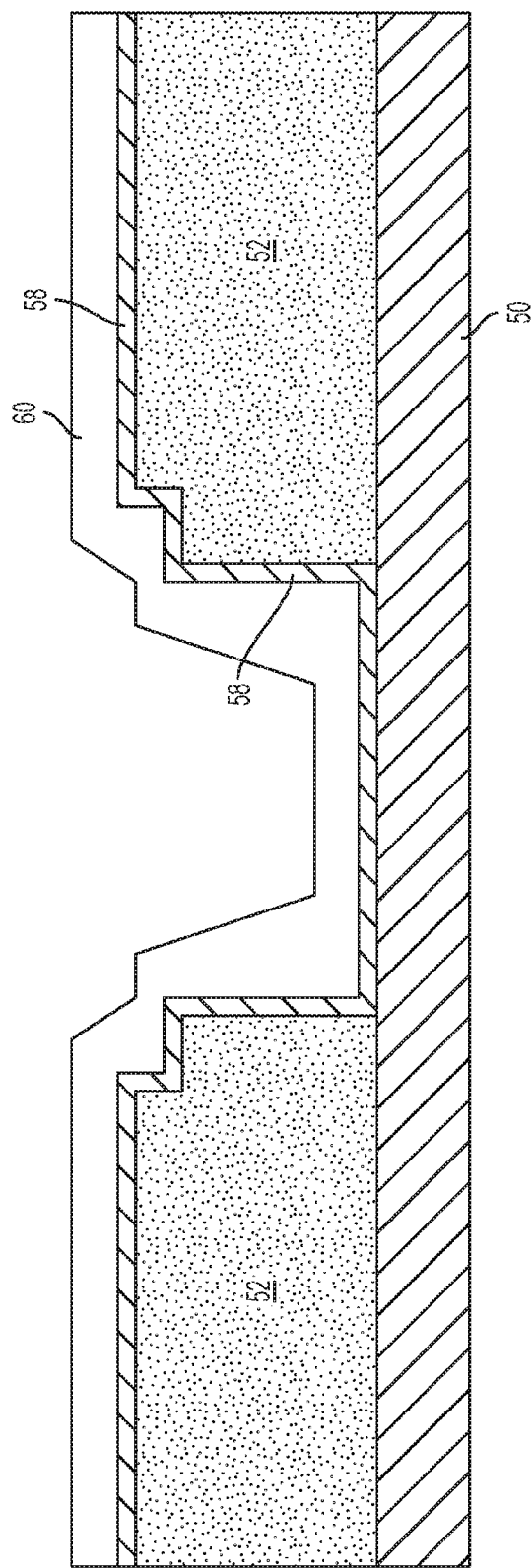

In FIG. 2C, a conductive metal layer 60 is partially deposited onto the metal liner layer 58. The conductive metal material may be selected from the group consisting of nickel (Ni), silver (Ag), gold (Au), palladium (Pd), cobalt (Co), copper (Cu), iron, (Fe), aluminum (Al), chromium (Cr), platinum (Pt), tungsten (W), and combinations thereof. The conductive metal material is deposited at a thickness of about 0.1 nanometer (nm) to about 100 nm so as to partially fill the trenches and vias. In one embodiment, the conductive metal material 60 is deposited at a thickness of about 80 nm.

The metal liner 58 and conductive metal material 60 may be deposited by sputtering, CVD, electroless deposition and/or electrodeposition. Rf bias sputtering, in general, is known in the art and involves the reemission of material during the sputter deposition thereof through the effects of attendant ion bombardment of the layer being deposited. In effect, Rf biased sputtering is the positive ion bombardment of a substrate or film during its deposition. Therefore, during Rf bias sputtering, there is always simultaneous etching and deposition of the material being deposited. Previously deposited layers are not etched as part of a standard Rf biased sputter deposition.

Figure 2D:
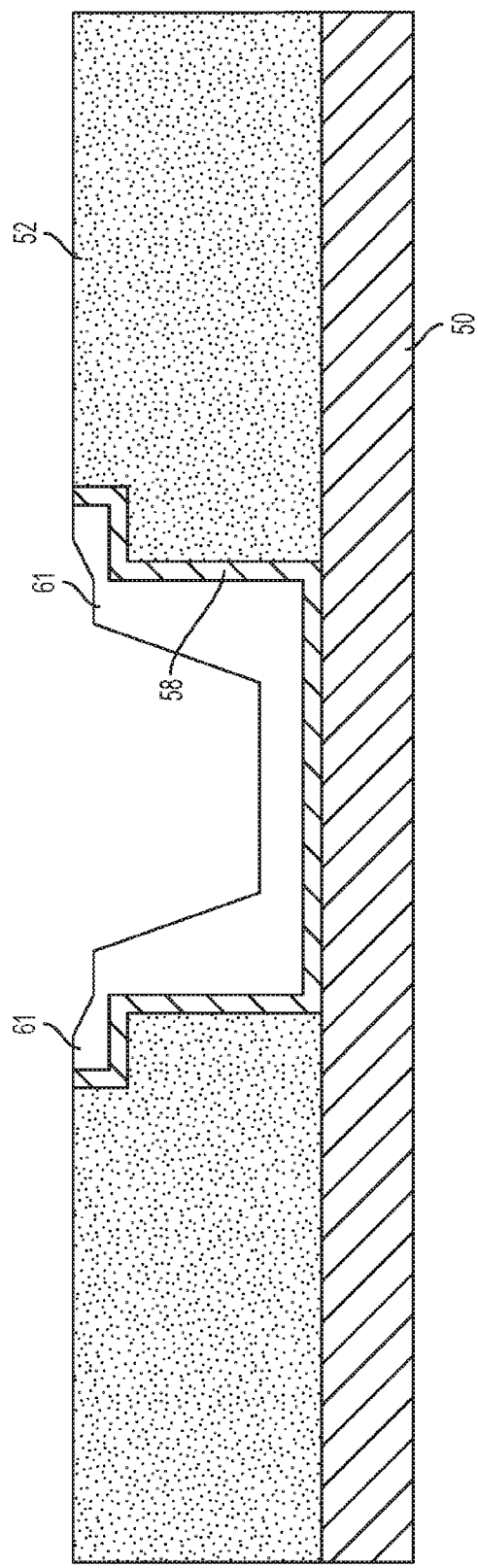
Figure 2E:
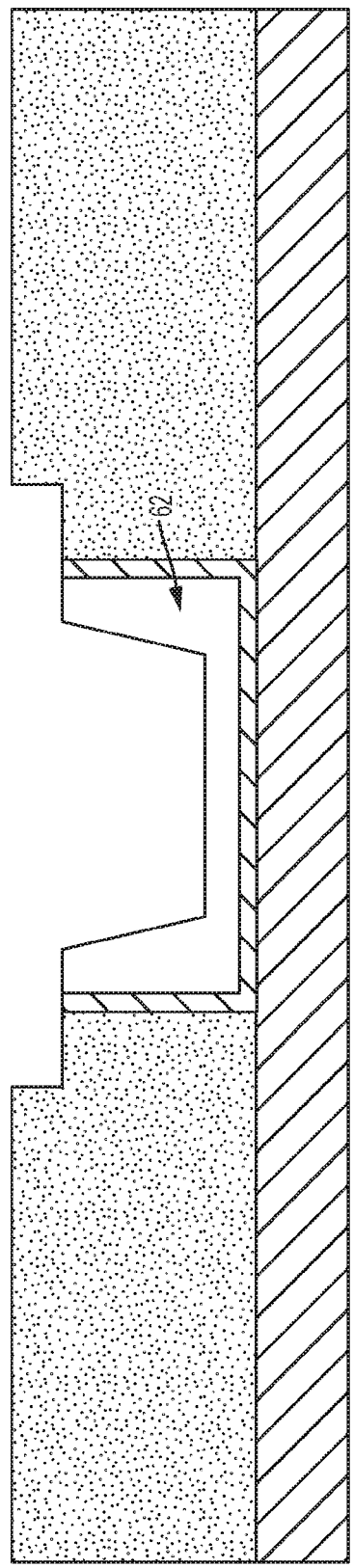

In FIGS. 2D and 2E, a chemical mechanical polishing (CMP) or anisotropic etch procedure is performed and configured to stop at the light transparent insulator layer 52 so as to remove the portion of the metal liner 58 and the conductive metal 60 overlying the uppermost surfaces of the light transparent insulator 52 including the metal recess 61 in the case of a dual damascene structure. As will be described in greater detail below, the resulting gate 62 of the overturned thin film device provides a three face design, which provides high on-current performance and provides increased latitude for gate length shrink for LED resolution improvement.

Figure 2F:
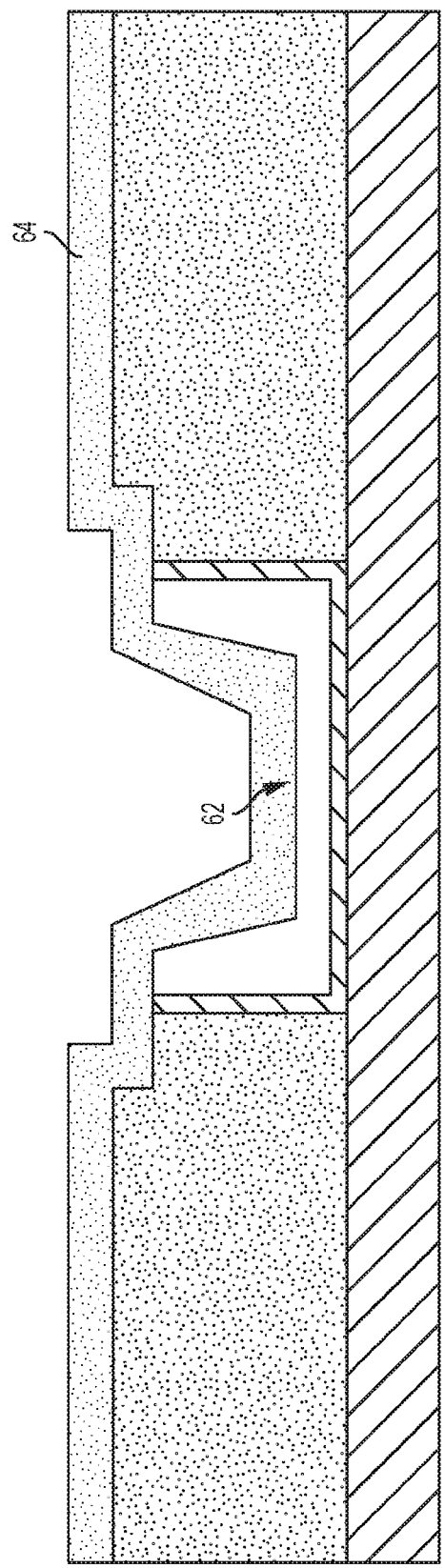

In FIG. 2F, a conformal gate insulating layer 64 of an insulating material is deposited onto the gate using atomic layer deposition (ALD). For example, the gate insulating layer may be formed of hafnium oxide ($HfO_2$), which has a higher dielectric constant relative to silicon dioxide ($SiO_2$), aluminum oxide ($Al_2O_3$), silicon nitride ($Si_3N_4$) or a combination thereof. By way of example, the thickness of the gate insulating layer 64 can be about 35 nm.

Figure 2G:
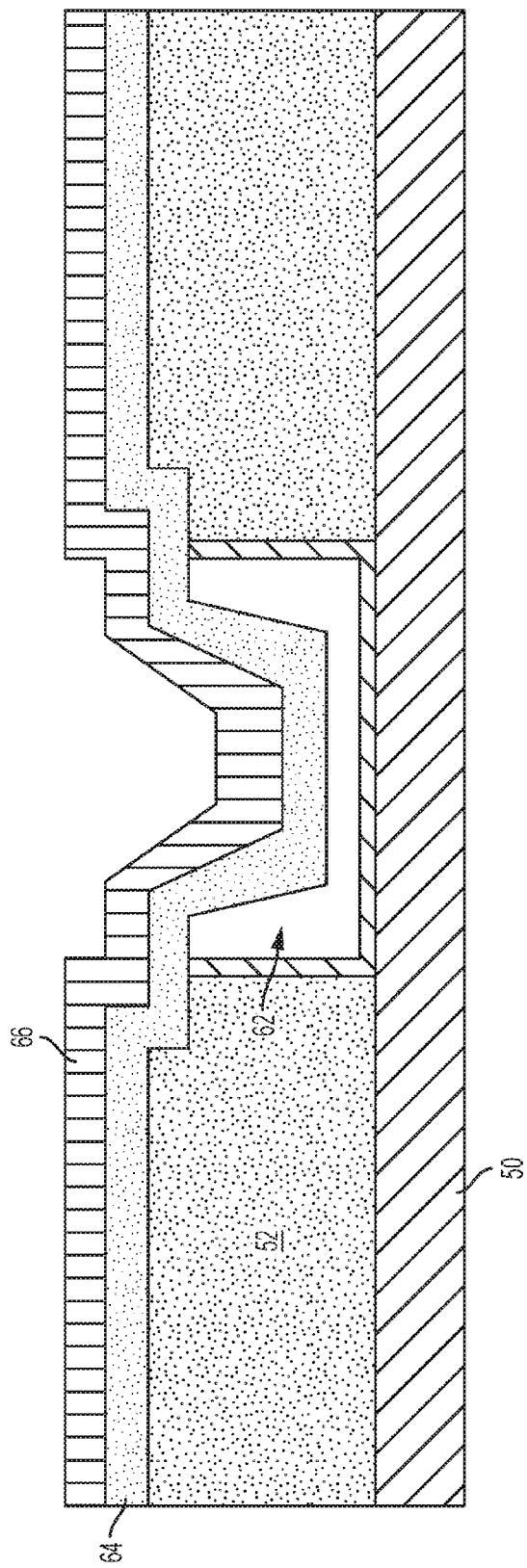

In FIG. 2G, a metal oxide channel layer 66 is conformally deposited onto the gate insulating layer 64. The metal oxide channel layer 66 may be deposited using conventional techniques. In one embodiment, the channel layer is an amorphous metal oxide including, but not limited to, indium, gallium, zinc oxide (IGZO), indium zinc oxide (IZO, and indium oxide ($In_2O_3$) for high mobility performance. The amorphous metal oxide can be photo- or thermally annealed as previously described.

Figure 2H:
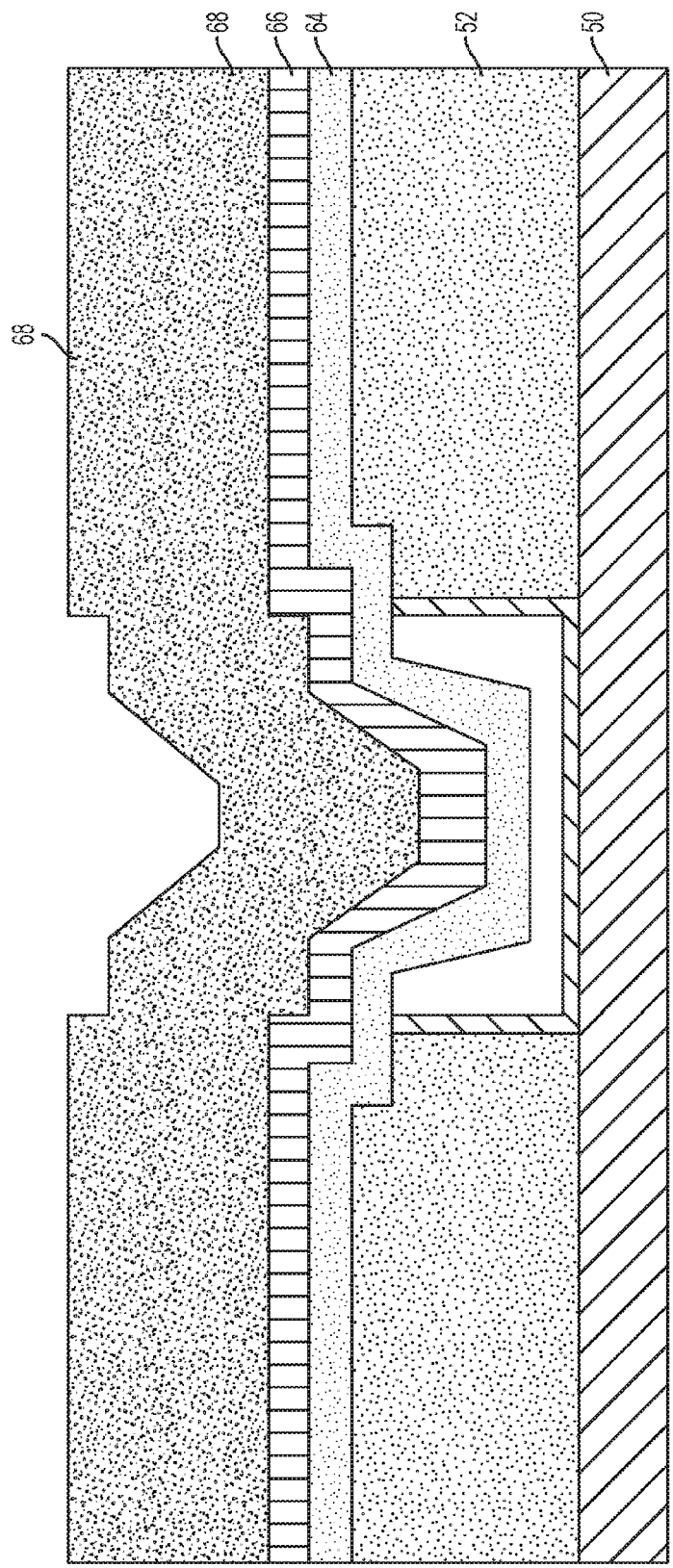
Figure 21:
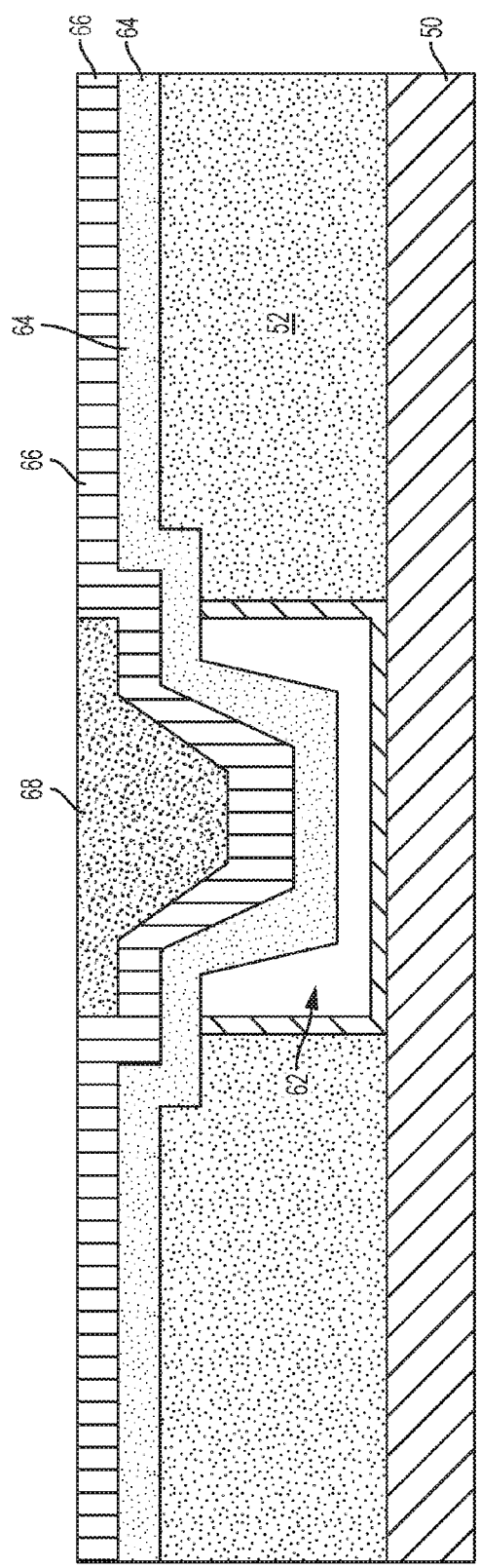
Figure 2J:
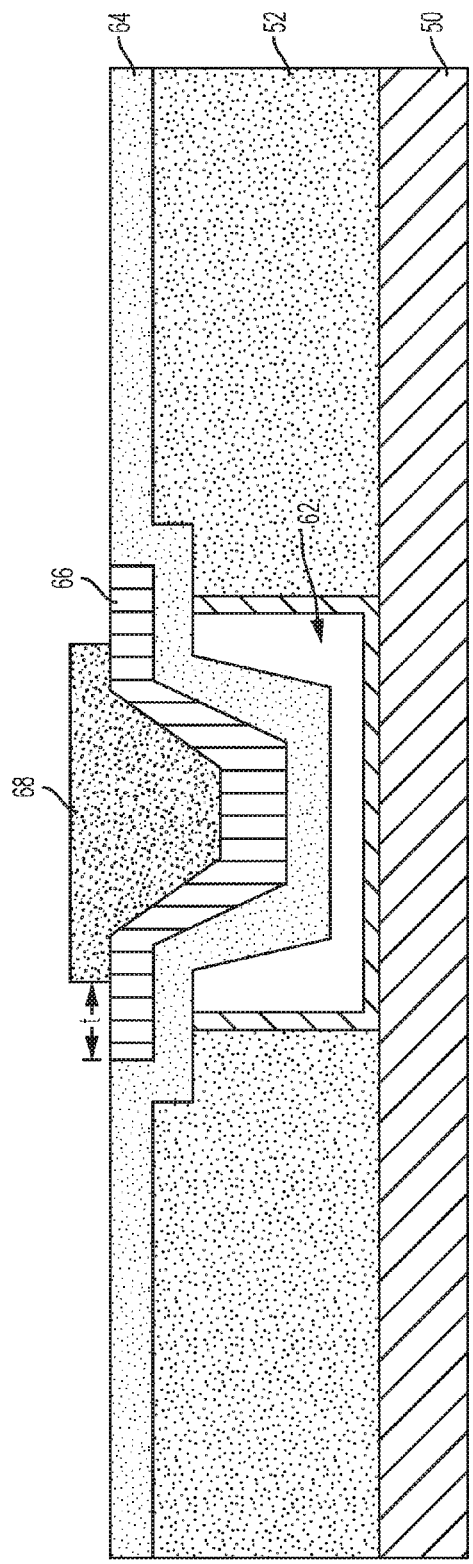

In FIGS. 2H-2I, a sacrificial dielectric insulator layer 68 is deposited and reflowed onto the structure followed by CMP of the sacrificial insulator layer configured to stop at the metal oxide channel layer 66 and provide a planar top surface as shown in FIG. 2J.

In FIG. 2J, a selective reactive ion etch is then performed on the metal oxide channel layer 66 configured to stop at the gate insulator layer 64 to define a self-aligned step width (t), which correlates to the width of the exposed metal oxide channel layer 66.

Figure 2K:
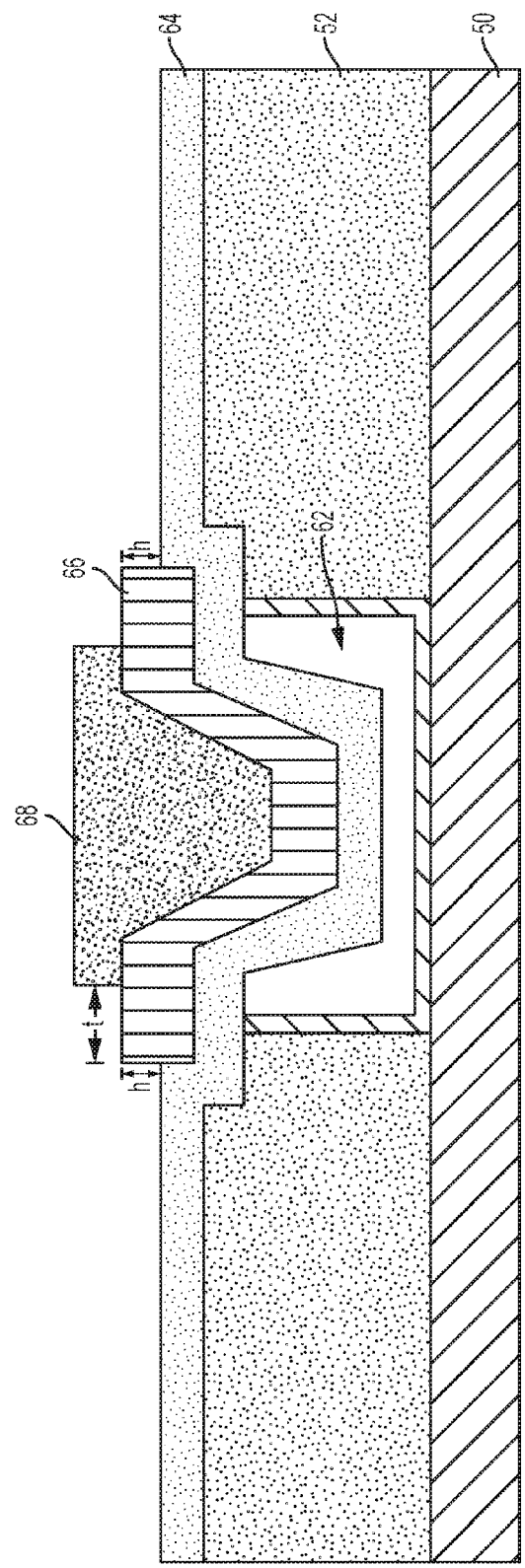

In FIG. 2K, a selective reactive ion etch of the gate insulator layer 64 is performed to remove a defined thickness and form a self-aligned source/drain region step height (h). Advantageously, the formation of the self-aligned source/drain region step height (h) defines the source/drain regions contact step height without requiring an extra hard mask step as is typically done in the prior art, and consequently, significantly reduces manufacturing costs and throughput.

Figure 2L:
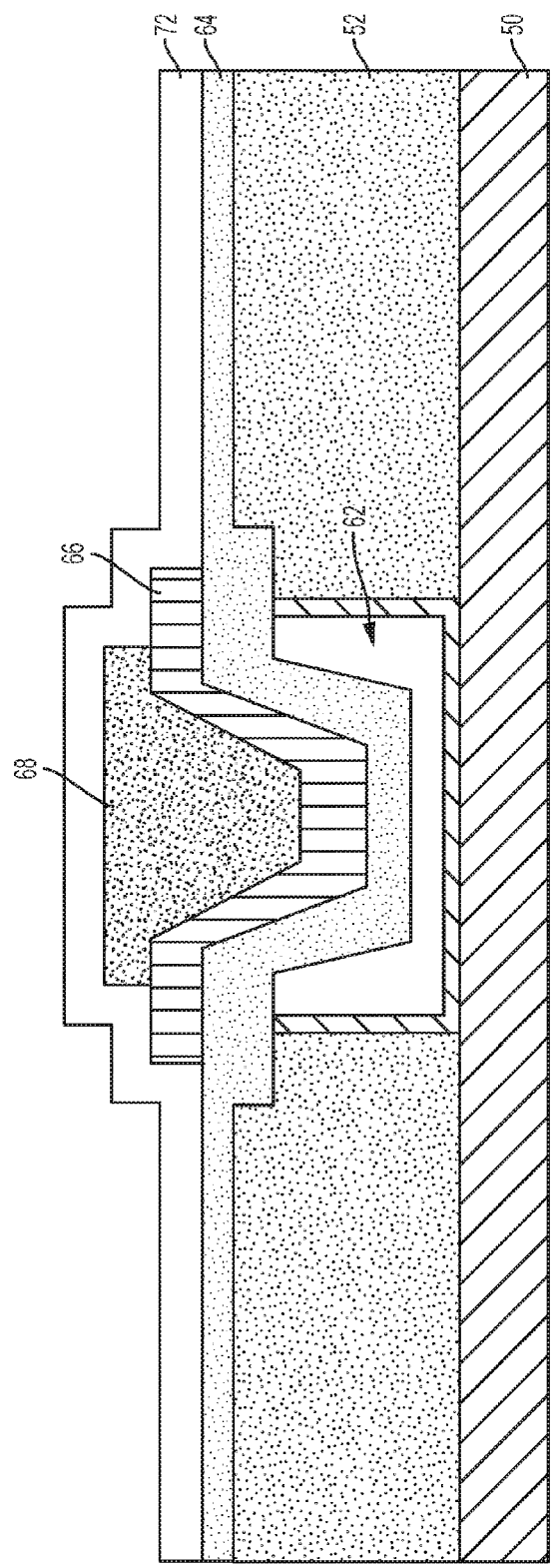

In FIG. 2L, a conformal layer of conductive metal 72 is deposited, which will subsequently be patterned to form the source and drain regions. For example, each of the source and the drain regions may be formed of a conductive metal such as, for example, Ti, Pt, ruthenium (Ru), Au, silver (Ag), molybdenum (Mo), Al, W, Cu, combinations thereof, a conductive metal oxide such as IZO, AZO, or combinations thereof.

Figure 2M:
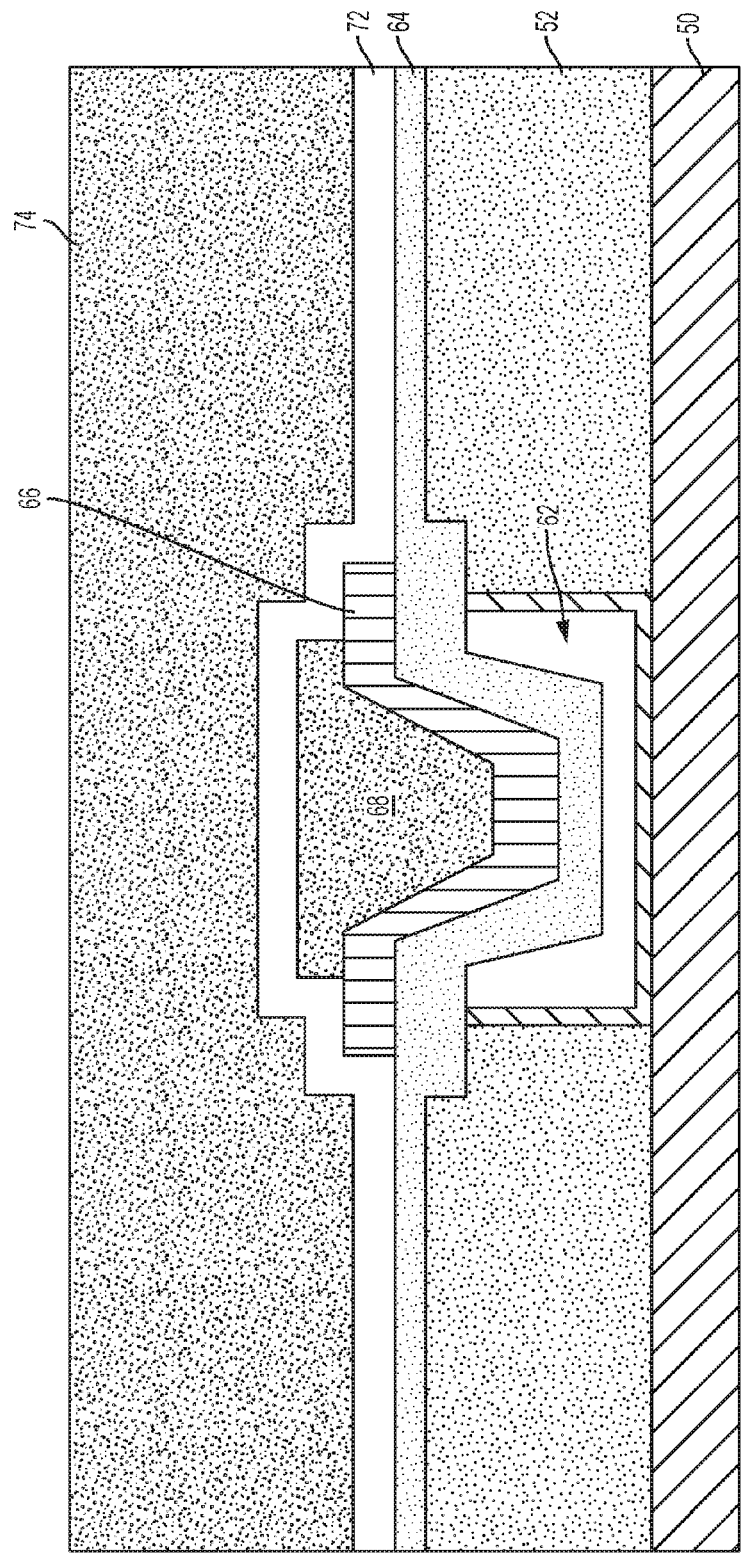
Figure 2N:
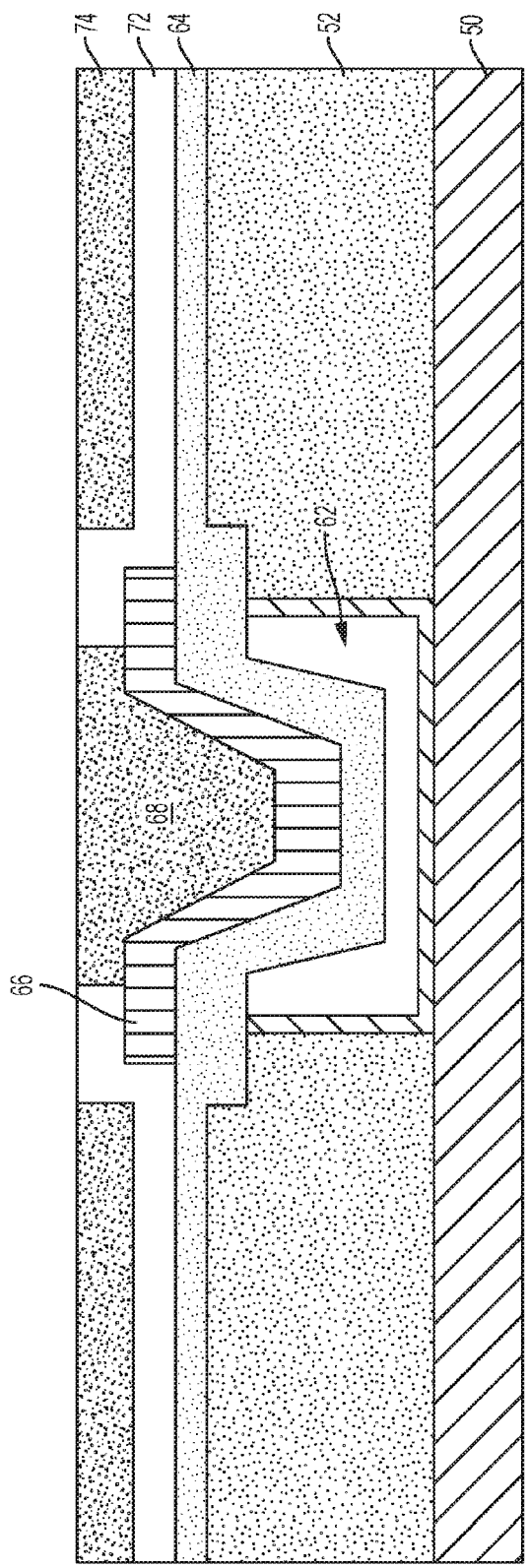
Figure 20:
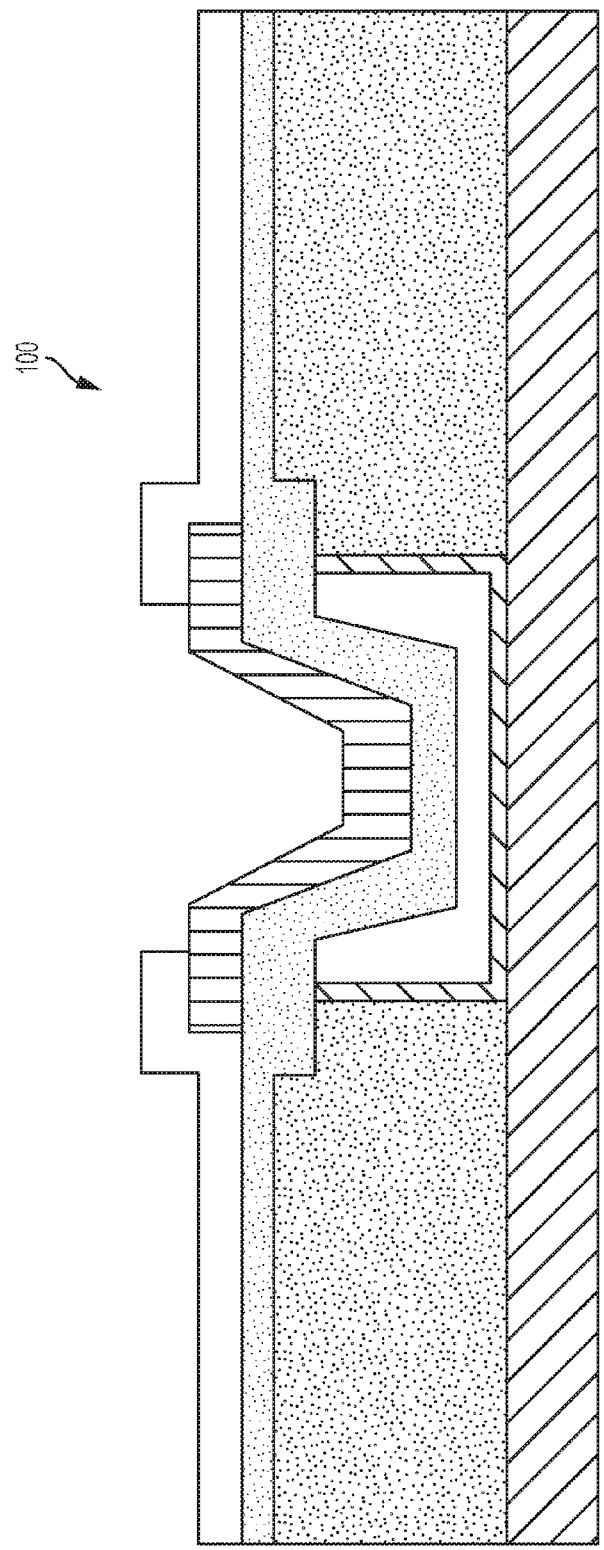

In FIG. 2M-N, a sacrificial insulator layer 74 is reflowed over the topography to form a planar top surface followed by a CMP or etch back procedure to remove a portion of the sacrificial layer and the portion of the source/drain metal layer 72 that had previously been deposited above the gate structure 62 and the metal oxide channel 66.

In FIG. 2O, the remaining sacrificial insulator layer 74 is then removed so as to provide a high performance flexible thin film transistor structure 100, which includes an amorphous metal oxide channel material for high mobility performance. Additionally, the TFT includes step width control (t) to minimize the overlap of electrodes and reduce the parasitic capacitances for high efficient light emitting diode (LED) performance. Still, further, the device as shown includes a three face gate metal design for high on current performance and provides margins for gate length shrink as is desired for LED resolution improvement.

Figure 3:
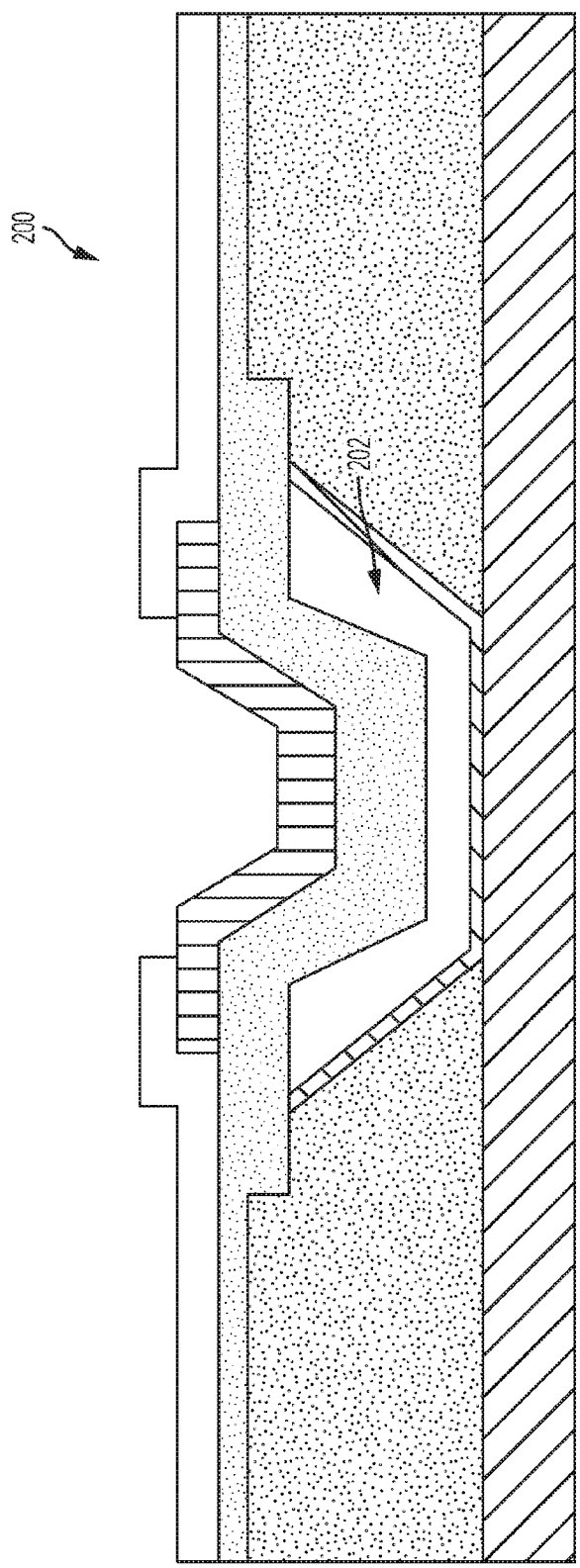
FIG. 3 depicts a schematic cross sectional view of a thin film device structure including a metal gate having a concave shape with three faces in accordance with another embodiment.

Advantageously, the gate metal shape can be changed as may be desired for improved process flexibility and performance requirements. For example, FIG. 3 schematically depicts a cross-sectional view of an overturned thin film device 200 including a gate metal shape 202 in accordance with another embodiment.

All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method of fabricating a transistor device, comprising:
   forming a light transparent insulating layer on a substrate;
   selectively etching an opening in the light transparent insulating layer to expose a surface of the substrate, wherein the opening is defined by a bottom surface and sidewalls extending from the bottom surface to an upper surface of the light transparent insulating layer, wherein selectively etching the opening in the light transparent insulating layer to the substrate comprises a dual damascene process, wherein the opening is defined by a trench and a via formed in the trench;
   conformally depositing a liner layer onto the substrate and the light transparent insulating layer including the sidewalls and the bottom surface defined by the opening;
   depositing a metal conductive layer over the substrate and partially filling the via;
   chemically mechanically polishing or anisotropically etching the metal conductive layer and the liner layer, wherein the light transparent insulator layer provides a stop; and
   removing portions of the metal conductive layer and the liner layer to expose sidewalls of the trench such that remaining portions of the metal conductive layer and the liner layer define a gate electrode in the opening, wherein the gate electrode has a concave shape defined by three faces.

2. The method of claim 1, further comprising:
   conformally depositing a gate insulating layer overlying the gate electrode;
   depositing an amorphous metal oxide layer overlying the gate insulating layer;
   depositing a sacrificial insulator layer onto the amorphous metal oxide layer;
   chemically mechanically polishing the sacrificial insulator layer to stop on the amorphous metal oxide layer, wherein a remaining portion of the sacrificial insulator layer overlays the gate electrode;
   selectively etching the amorphous metal oxide layer to define a channel and expose end portions of the channel to define a self-aligned step width (t);
   selectively etching a portion of the gate insulator layer to define a contact step height (h) for the exposed end portions of the channel;
   conformally depositing a conductive metal layer and forming source/drain regions on the exposed end portions including the self-aligned step width (t) and contact step height (h) of the channel by removing the conductive metal layer overlaying the remaining portion of the sacrificial insulator layer, thereby effecting gate-aligned source and drain regions; and
   removing the sacrificial insulator layer.

3. The method of claim 2, wherein depositing the amorphous metal oxide layer comprises solution depositing a precursor solution and photo annealing the deposited precursor to form the amorphous metal oxide layer.

4. The method of claim 2, wherein depositing the amorphous metal oxide layer comprises solution depositing a precursor solution and thermally annealing the deposited precursor to form the amorphous metal oxide layer.

5. The method of claim 2, wherein conformally depositing the gate insulating layer comprises atomic layer deposition.

6. The method of claim 2, wherein the gate insulating layer comprises hafnium oxide, aluminum oxide, silicon nitride, or a combination thereof.

7. The method of claim 2, wherein the amorphous metal oxide layer comprises indium gallium zinc oxide (IGZO), indium zinc oxide (IZO), indium zinc tin oxide (IZTO,) or indium oxide ($In_2O_3$).

8. A method of fabricating a transistor device, comprising:
   forming a gate structure having a concave shape defined by three faces by a dual damascene process;
   conformally depositing a gate insulating layer overlying the gate structure;
   depositing an amorphous metal oxide layer overlying the gate insulating layer;
   depositing a sacrificial insulator layer onto the amorphous metal oxide layer;
   chemically mechanically polishing the sacrificial insulator layer to stop on the amorphous metal oxide layer, wherein a remaining portion of the sacrificial insulator layer overlays the gate structure;
   selectively etching the amorphous metal oxide layer to define a channel and expose end portions of the channel to define a self-aligned step width (t);
   selectively etching to remove a portion of the gate insulator layer and define a contact step height (h) for the exposed end portions of the channel;
   conformally depositing a conductive metal layer and forming source/drain regions on the exposed end portions including the self-aligned step width (t) and contact step height (h) of the channel by removing the conductive metal layer overlaying the sacrificial insulator layer, thereby effecting gate-aligned source and drain regions; and
   removing the sacrificial insulator layer.

\* \* \* \* \*